United States Patent
Yamauchi et al.

(10) Patent No.: US 10,163,645 B2
(45) Date of Patent: Dec. 25, 2018

(54) METHOD FOR PROCESSING WIDE-BANDGAP SEMICONDUCTOR SUBSTRATE AND APPARATUS THEREFOR

(71) Applicants: OSAKA UNIVERSITY, Suita-shi (JP); TOHO Engineering Co., Ltd., Yokkaichi-shi (JP)

(72) Inventors: Kazuto Yamauchi, Suita (JP); Ai Isohashi, Suita (JP); Yasuhisa Sano, Suita (JP)

(73) Assignees: OSAKA UNIVERSITY, Suita-shi (JP); TOHO ENGINEERING CO., LTD., Yokkaichi-shi (JP)

( * ) Notice: Subject to any disclaimer, the term of this patent is extended or adjusted under 35 U.S.C. 154(b) by 0 days.

(21) Appl. No.: 15/125,308

(22) PCT Filed: Mar. 11, 2015

(86) PCT No.: PCT/JP2015/057156
§ 371 (c)(1),
(2) Date: Sep. 12, 2016

(87) PCT Pub. No.: WO2015/137397
PCT Pub. Date: Sep. 17, 2015

(65) Prior Publication Data
US 2017/0069506 A1   Mar. 9, 2017

(30) Foreign Application Priority Data

Mar. 12, 2014   (JP) ................................ 2014-049071

(51) Int. Cl.
*H01L 21/306* (2006.01)
*H01L 21/3213* (2006.01)
(Continued)

(52) U.S. Cl.
CPC .. *H01L 21/30612* (2013.01); *H01L 21/02019* (2013.01); *H01L 21/0445* (2013.01);
(Continued)

(58) Field of Classification Search
None
See application file for complete search history.

(56) References Cited

U.S. PATENT DOCUMENTS

2009/0095712 A1*   4/2009   Yamauchi ......... H01L 21/02019
                                                          216/53

FOREIGN PATENT DOCUMENTS

JP   H10-58236        3/1998
JP   2006-114632 A1   4/2006
(Continued)

OTHER PUBLICATIONS

J. Murata et al., Journal of the Electrochemical Society, vol. 159, pp. H417-H420 (Year: 2012).*
(Continued)

*Primary Examiner* — Jiong-Ping Lu
(74) *Attorney, Agent, or Firm* — Kratz, Quintos & Hanson, LLP

(57) ABSTRACT

There are provided a processing method for a wide-bandgap semiconductor substrate and an apparatus therefor that use no abrasives or no abrasive grains, or no solution having a large environmental burden at all, can process a single crystal, which is SiC, GaN, AlGaN, or AlN, at a variety of processing speed, can obtain a surface of higher quality than the quality of a surface finished by CMP, and also have an excellent compatibility with a clean room. A catalytic substance having a function of promoting the direct hydrolysis of a work piece (5) or promoting the hydrolysis of an oxide film on the surface of the work piece is used as a processing reference plane (3). In the presence of water (1), the work
(Continued)

piece is brought into contact with or extremely close to the processing reference plane at a predetermined pressure.

4 Claims, 14 Drawing Sheets

(51) Int. Cl.
  *H01L 21/02* (2006.01)
  *H01L 21/302* (2006.01)
  *H01L 21/04* (2006.01)
  *H01L 21/67* (2006.01)
  *H01L 29/16* (2006.01)

(52) U.S. Cl.
  CPC ........ *H01L 21/0475* (2013.01); *H01L 21/302* (2013.01); *H01L 21/30604* (2013.01); *H01L 21/30625* (2013.01); *H01L 21/32134* (2013.01); *H01L 21/67086* (2013.01); *H01L 29/1608* (2013.01)

(56) References Cited

FOREIGN PATENT DOCUMENTS

| | | |
|---|---|---|
| JP | 2011-146695 A1 | 7/2011 |
| JP | 2012-64972 A1 | 3/2012 |
| WO | WO 2013/084934 A1 | 6/2013 |

OTHER PUBLICATIONS

J. Murata, et al.; "Atomically Smooth Gallium Nitride Surfaces Prepared by Chemical Etching with Platinum Catalyst in Water;" Journal of the Electrochemical Society; vol. 159; No. 4; 2012; pp. H417-H420 and cover sheet (5 Sheets total)/Cited in International Search Report.

Y. Sano, et al.; "Planarization of SiC and GaN Wafers Using Polishing Technique Utilizing Catalyst Surface Reaction;" ECS Journal of Solid State Science and Technology; vol. 2; No. 8; 2013; pp. N3028-N3035 (8 Sheets total)/Cited in International Search Report.

International Search Report for International Application No. PCT/JP2015/057156 dated May 12, 2015.

\* cited by examiner

Fig. 4(a)
Fig. 4(b)
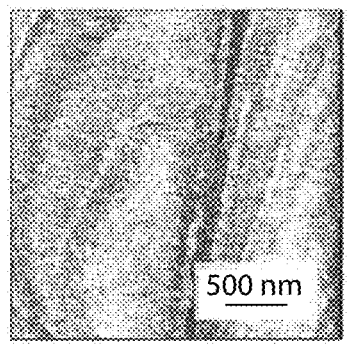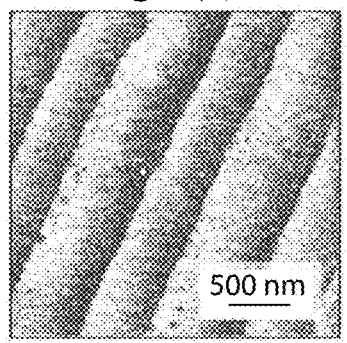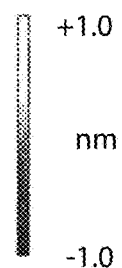
Fig. 5(a)
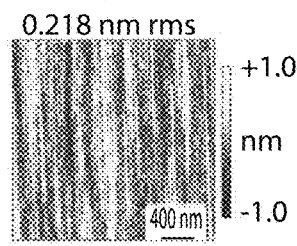
Fig. 5(b)  Fig. 5(c)  Fig. 5(d)
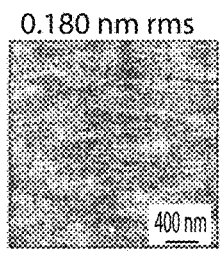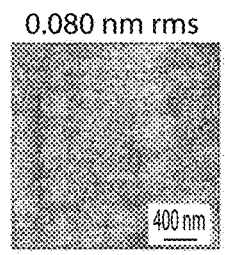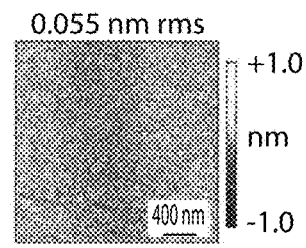

METHOD FOR PROCESSING WIDE-BANDGAP SEMICONDUCTOR SUBSTRATE AND APPARATUS THEREFOR

TECHNICAL FIELD

The present invention relates to a method for processing a wide-bandgap semiconductor substrate and an apparatus therefor, and more specifically to a processing method that can process a wide-bandgap semiconductor substrate, such as an SiC substrate and a GaN substrate, with a decreased environmental burden and an apparatus therefor.

BACKGROUND ART

Conventionally, in the field of manufacture of semiconductor devices, there are provided various methods of planarizing or polishing the surface of an Si substrate including Si wafers in high quality. Typically, there is CMP (Chemical Mechanical Polishing). In recent years, as a new technique of processing a hard-to-work material, such as SiC, and a solid oxide film, such as optical glass, CARE (CAtalyst-Referred Etching) has been proposed.

CMP is a technique, in which by a surface chemical action caused by an abrasive (an abrasive grain) or by the action of chemical components contained in a polishing liquid, the effect of mechanical polishing (the removal of a surface) caused by the relative motion between an abrasive and an object to be polished is increased to obtain a smoothly polished surface at high speed. Commonly, an object to be polished is held by a member called a carrier, the object to be polished is pressed against a platen (a lap) covered with a polishing cloth or a polishing pad, and then the carrier and the platen are relatively moved to each other for polishing, with slurry containing various chemical components and hard, and fine abrasive grains being supplied. Chemical components change the surface of the object to be polished to improve processing speed, compared with the case of polishing an object to be polished using only an abrasive. CMP significantly reduces fine flaws remaining on the surface or an affected layer remaining near the surface in the case of polishing the object to be polished using only an abrasive, allowing an ideal smooth surface to be obtained. Here, for the abrasive used in CMP, fine particles of colloidal silica ($SiO_2$), ceric oxide ($CeO_2$), or ceric oxide containing lanthanum are mainly used, depending on the material of a work piece. The polishing speed (the processing speed) for SiC substrates by previously existing CMP ranges from 20 to 60 nm/h. However, previously existing CMP uses hard diamond abrasive grains, and thus, the surface is damaged.

However, because producer countries of cerium, which is a rare earth element, are unevenly distributed, the stable supply of cerium has a geopolitical risk. Actually, in these years, the event, in which violent fluctuations in rare earth element prices raised a critical problem to industrial circles, is fresh in memory. It is inevitable to face the problem of the depletion of rare earth element sources in future. In addition, CMP uses fine particles, such as colloidal silica, causing problems, such as expensive costs in treating a polishing liquid and poor compatibility of fine particles with a clean room.

In Patent Document 1, the present inventors propose a catalyst-assisted chemical processing method, in which a work piece is put into a processing liquid, to which molecules containing halogen exhibiting no solubility to the work piece in an ordinary state are dissolved, a catalyst made of a platinum, gold, or ceramic-based solid catalyst is brought into contact with or extremely close to the processed surface of the work piece, and the work piece is processed by eluting halogen compounds, which are produced by a chemical reaction between halogen radicals produced on the surface of the catalyst and atoms on the surface of the work piece. More specifically, in Patent Document 1, an example is shown, in which for a processing liquid, to which molecules containing halogen are dissolved, a hydrogen fluoride solution or hydrogen chloride solution is used to process Si, SiC, sapphire, and others.

This processing method based on the reference plane of the catalyst is an ultraprecision planarization technique termed as CARE by the present inventors. CARE is a processing technique using no abrasives or no abrasive grains and an ideal processing method causing no scratches or introducing no affected layers on a processed surface by processing. However, CARE uses a processing liquid, to which molecules containing halogen are dissolved, specifically a hydrogen fluoride solution, causing necessities of the airtightness of processing spaces and processing facilities for exhaust gas and waste liquids. Thus, there are problems that costs of handling and apparatus are more increased than in CMP. Originally, CARE is a technique developed to aim for highly efficiently and highly precisely processing of a hard-to-work material, such as SiC, without introducing any affected layers. In CARE (HF-CARE) using a hydrogen fluoride solution, SiC and GaN can be processed at high speed at a practical level. However, elution caused by hydrogen fluoride proceeds on recesses on the surface as well and thus, surface roughness is not excellent so much. Moreover, because hydrogen fluoride solutions are hazardous and difficult to treat, it is difficult to use hydrogen fluoride solutions for general purposes.

Meanwhile, Patent Document 2 discloses a processing method, in which using only ultrapure water except inevitable impurities in trace amounts, an ionic product is increased using an electrochemical reaction on the surface of a solid having an ion exchange function or catalyst function, the solid being disposed in the ultrapure water, a work piece is immersed in the ultrapure water with the concentration of hydroxyl groups or hydroxyl group ions being increased, the hydroxyl group ions are attracted to the surface of the work piece using the work piece as an anode or with the potential of the work piece being maintained at high level, and the surface of the work piece is removed, or an oxide film is formed on the surface of the work piece by a chemical elution reaction or an oxidation reaction caused by the hydroxyl groups or hydroxyl group ions.

The processing method described in Patent Document 2 is basically electrochemical machining, in which a high voltage is applied. The key requirement is the hydroxyl group increasing process that increases the concentration of hydroxyl groups or hydroxyl group ions in water. For this hydroxyl group increasing process, the surface of the solid having the ion exchange function or catalyst function is used. However, there are problems that the solid contacts the work piece, is damaged, and attached to the surface of the work piece, for example. Thus, the surface of the solid having the ion exchange function or catalyst function and the work piece are basically in a non-contact state. In this state, the process proceeds as the hydroxyl groups or the hydroxyl group ions, which are produced on the surface of the solid, are supplied to the surface of the work piece. However, in the processing method, no processing reference plane is present. Thus the processing method is not commercially available because a highly precise surface is not obtained, the processing speed is slow, and for other reasons.

Patent Document 3 discloses a processing method for a solid oxide film. The method is a processing method, in which a solid oxide film having one kind or two or more kinds of elements bonded through oxygen or a multicomponent solid oxide film formed of a plurality of oxide films is a work piece, and the surface of the work piece is planarized or processed in an arbitrary curved surface. In the method, a catalytic substance is used as a processing reference plane. The catalytic substance assists the production of decomposition products by hydrolysis, in which a water molecule is dissociated to cut back-bonding between an oxygen element and the other element forming a solid oxide film, and adsorbed to the elements. In the presence of water, the work piece is brought into contact with or extremely close to the processing reference plane. The potential of the processing reference plane is set in a range including a rest potential and producing no $H_2$ and no $O_2$. The work piece and the processing reference plane are relatively moved to each other to remove decomposition products from the surface of the work piece.

The processing method described in Patent Document 3 is CARE (Water-CARE) using only water, which is an epoch-making method. CARE (Water-CARE) uses no abrasives or no abrasive grains, including rare earth elements, at all. CARE (Water-CARE) uses no solutions, which are difficult to be handled, such as hydrogen fluoride, and have a large environmental burden, at all. CARE (Water-CARE) can process a solid oxide film, such as an optical material, without introducing any affected layers.

CITATION LIST

Patent Literature

Patent Document 1: JP-A No. 2006-114632
Patent Document 2: JP-A No. H10-58236
Patent Document 3: International Publication WO2013/084934

SUMMARY OF INVENTION

Technical Problem

In order to respond to a request for rare-earth-free processes, based on an idea in which with the oxidation of the surface of a wide-bandgap semiconductor, such as SiC, GaN, and other semiconductors, the resulting oxide film is removed using Water-CARE described in Patent Document 3, and thus SiC, GaN, and other semiconductors can be planarized (polished) or can be processed into an arbitrary curved surface at industrially usable processing speed, the present inventors investigated processing methods that can obtain a surface of higher quality than the quality of a surface finished by CMP, and invented the present invention.

In other words, under the foregoing situations, an object to be solved by the present invention is to provide a method for processing a wide-bandgap semiconductor substrate and an apparatus therefor that use no abrasives or no abrasive grains, including rare earth elements, at all, use no solutions that are difficult to be handled, such as hydrogen fluoride, and have a large environmental burden, at all, can process a wide-bandgap semiconductor, such as SiC, GaN, and other semiconductors, at a variety of processing speed, can obtain a surface of higher quality than the quality of a surface finished by CMP, and have an excellent compatibility with a clean room.

Solution to Problem

In order to solve the above problems, in the present invention, there is configured a processing method for a wide-bandgap semiconductor substrate in which a single crystal, which is SiC, GaN, AlGaN, or AlN, is a work piece, and a surface of the work piece is planarized or processed into an arbitrary curved surface using no abrasive grain or no abrasive. The method includes: using a catalytic substance having a function of promoting direct hydrolysis of the work piece or promoting hydrolysis of an oxide film on the surface of the work piece as a processing reference plane; in presence of water, bringing the work piece into contact with or extremely close to the processing reference plane at a predetermined pressure and relatively moving the work piece and the processing reference plane to each other; by a catalyst function of the processing reference plane, advancing a process of direct hydrolysis of the surface of the work piece or a process of oxidation of the surface of the work piece and hydrolysis of the oxide film in priority from a projection on the surface close to the processing reference plane; and removing a decomposition product.

In the present invention, there is configured a processing apparatus for a wide-bandgap semiconductor substrate in which a single crystal, which is SiC, GaN, AlGaN, or AlN, is a work piece, and a surface of the work piece is planarized or processed into an arbitrary curved surface using no abrasive grain or no abrasive. The apparatus includes: a container that holds water; a processing pat having a processing reference plane, the processing reference plane having a catalytic substance on its surface, the catalytic substance having a function of promoting direct hydrolysis of a work piece or promoting hydrolysis of an oxide film on a surface of the work piece, the processing pat being disposed in the container as immersed in water; a holder disposed in the container, the holder holding and immersing the work piece in water, the holder bringing the work piece into contact with the processing reference plane; and a driving mechanism that relatively moves the processing pat to the holder, with the processing pat being in contact with the holder at a predetermined pressure. In the processing apparatus, in presence of water, the work piece is brought into contact with or extremely close to the processing reference plane at a predetermined pressure and the work piece and the processing reference plane are relatively moved to each other; by a catalyst function of the processing reference plane, a process of direct hydrolysis of the surface of the work piece or a process of oxidation of the surface of the work piece and hydrolysis of the oxide film is advanced in priority from a projection on the surface close to the processing reference plane; and a decomposition product is removed.

More preferably, in these aspects of the present invention, there is provided a potential control unit included in the processing reference plane having a conductive catalytic substance at least on its surface, the potential control unit controlling processing speed by changing a potential of the catalytic substance. A potential of the processing reference plane is set in a range of ±1 V relative to an oxygen production potential to form a state in which oxygen is adsorbed to a catalyst surface, promoting the oxidation of the surface of the work piece.

More preferably, for the processing reference plane, a surface of the catalytic substance is used, in which a metallic element is contained and a d orbital of an electron of the metallic element is near Fermi level, and specifically, the metallic element is a transition metallic element. For the water, a mixture is used, in which at least one kind of a pH regulator, a buffer solution, or a complex solution that assists dissolution of a decomposition product is mixed in pure water or ultrapure water.

Here, in the present invention, the processing reference plane is a concept including a surface in which a hard surface is entirely or partially formed of a catalytic substance, a surface in which a film of a catalytic substance is entirely or partially formed on a hard surface, a surface in which a soft surface is entirely or partially formed of a catalytic substance, a surface in which a film of a catalytic substance is entirely or partially formed on a soft surface, or a surface in which a catalytic substance appears at least on a part of a surface by kneading the catalytic substance into a base material or by carrying the catalytic substance on the base material. The processing reference plane may have grooves in a radial, concentric circle, or spiral pattern, or in other patterns Advantageous Effects of Invention The processing method for a wide-bandgap semiconductor substrate according to the present invention described above is a processing method in which a single crystal, which is SiC, GaN, AlGaN, or AlN, is a work piece, and a surface of the work piece is planarized or processed into an arbitrary curved surface using no abrasive grain or no abrasive. The processing method includes: using a catalytic substance having a function of promoting direct hydrolysis of the work piece or promoting hydrolysis of an oxide film on the surface of the work piece as a processing reference plane; in presence of water, bringing the work piece into contact with or extremely close to the processing reference plane at a predetermined pressure and relatively moving the work piece and the processing reference plane to each other; by a catalyst function of the processing reference plane, advancing a process of direct hydrolysis of the surface of the work piece or a process of oxidation of the surface of the work piece and hydrolysis of the oxide film in priority from a projection on the surface close to the processing reference plane; and removing a decomposition product. Thus, the method can planarize or process the work piece into an arbitrary curved surface. The method has an excellent compatibility with a clean room. The method is easily applied to the fabrication steps of semiconductor devices. The present invention is chemical processing. Thus, the surface of the Si substrate can be processed, without introducing any affected layers. No abrasives or no abrasive grains are used at all on the processed surface. Thus, the surface roughness can be extremely made small, and a surface of higher quality than the quality of a surface finished by CMP can be obtained. Moreover, in the present invention, no chemical agents or no fine particles difficult to be handled, including hydrogen fluoride and other chemical agents, are used. Thus, waste liquids can be extremely easily processed, leading to an advantage in which work environments are greatly improved, although the present invention is a processing method with a small environmental burden. Moreover, no rare earth elements are used at all. Thus, the present invention is not affected by raw material market conditions, allowing running costs to be greatly decreased. In addition, in the present invention, the processing speed is easily controlled, and it is unnecessary to change processing liquids in order to change processes from coarse polishing to precise polishing unlike CMP.

A potential control unit is included in the processing reference plane having a conductive catalytic substance at least on its surface, the potential control unit controlling processing speed by changing a potential of the catalytic substance. A potential of the processing reference plane is set in a range of ±1 V relative to an oxygen production potential. In this setting, conditions can be set, in which the surface oxidation of a wide-bandgap semiconductor substrate, such as SiC and GaN, which are hard-to-work materials, can be promoted, allowing a great increase in the processing speed. Controlling the catalyst potential allows the processing conditions to be easily changed by controlling the processing speed in the wide range from coarse processing at fast processing speed to precise processing at slow processing speed. In other words, in the present invention, a series of processes from coarse processing to precise processing can be performed only by changing the potential of the catalytic substance as the work piece is set on the processing apparatus. Thus, the working efficiency is excellent. In contrast, conventionally, in the case of using the processing apparatus, it is necessary to replace a polishing pat, an abrasive, or an abrasive grain after the processing work is stopped in the middle of processing. In the case of using dedicated apparatuses, a coarse processing apparatus and a precise processing apparatus, it is necessary to transfer the work piece between these apparatuses.

The surface of the SiC substrate or the GaN substrate is oxidized by the catalyst function included in the processing reference plane. In the oxide film formed on the surface of the substrate, by the catalyst function included in the processing reference plane, a water molecule is dissociated to cut back-bonding between an oxygen element and an element forming the substrate, and adsorbed to the elements, decomposition products caused by hydrolysis are removed, and thus processing proceeds. Here, projections on the oxide film of the SiC substrate or the GaN substrate are etched in priority. Thus, similarly to CMP, a function is achieved, in which the pat surface is uniformly transferred. In addition, processing is performed by pure, chemical actions using no abrasive grains or no abrasives. Thus, the surface of higher quality than the quality of the surface finished by CMP can be obtained.

For the processing reference plane, a surface of the catalytic substance is used, in which a metallic element is contained and a d orbital of an electron of the metallic element is near Fermi level. This provides a great effect of taking electrons from water molecules and sharing them. Thus, an effect is increased, in which a water molecule is dissociated to cut back-bonding between an oxygen element and the other element forming an oxide film, and adsorbed to the elements, causing an increase in the effect of assisting the production of decomposition products caused by hydrolysis. Accordingly, the processing speed can be improved. Specifically, the effect is noticeable when the metallic element is a transition metallic element.

In the case in which the processing reference plane has a conductive catalytic substance at least on its surface, the gap between the work piece and the catalytic substance is narrowed to the extent in which free electrons of the catalytic substance exert the effect of reducing obstacles in reactions to both phenomena, the dissociation of water molecules and loose back-bonding of the oxide film. Thus, processing efficiency can be improved to an industrially usable level, as well as highly precise processing can be performed because the catalytic substance is the processing reference plane.

BRIEF DESCRIPTION OF THE DRAWINGS

FIGS. 4(a) and 4(b) are states of the surface of a 4H-SiC substrate before and after planarization; FIG. 4(a) is an AFM image before planarization, and FIG. 4(b) is an AFM image after planarization.

FIG. 5(a), FIG. 5(b), FIG. 5(c) and FIG. 5(d) are changes in the state of the surface of a 4H-SiC substrate in planarization; FIG. 5(a) is an AFM image before planarization, FIG. 5(b) is an AFM image after planarization for one minute, FIG. 5(c) is an AFM image after planarization for two minutes, and FIG. 5(d) is an AFM image after planarization for three minutes.

FIG. 6(a) is a phase shift interference microscope image before planarization, FIG. 6(b) is a phase shift interference microscope image after planarization for 60 minutes, FIG. 6(c) is an AFM image before planarization, FIG. 6(d) is an AFM image after planarization for 30 minutes, and FIG. 6(e) is an AFM image after planarization for 60 minutes.

FIGS. 7(a) and 7(b) are phase shift interference microscope images, and FIGS. 7(c) and 7(d) are AFM images.

FIGS. 8(a) and 8(b) are phase shift interference microscope images after planarization for 30 minutes, FIGS. 8(c) and 8(d) are phase shift interference microscope images after planarization for 60 minutes, and FIGS. 8(e) and 8(f) are phase shift interference microscope images after planarization for 90 minutes.

FIGS. 9(a) and 9(b) are phase shift interference microscope images after planarization for 120 minutes, FIGS. 9(c) and 9(d) are AFM images after planarization for 120 minutes.

DESCRIPTION OF EMBODIMENTS

Figure 1:
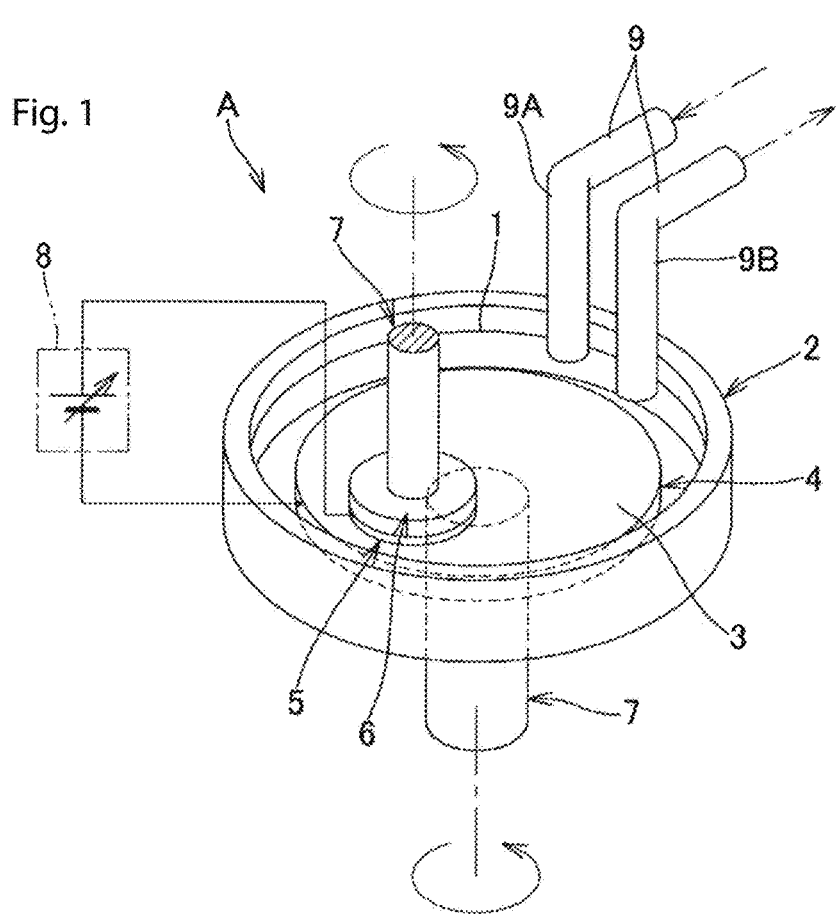
FIG. 1 is a schematic perspective view illustrating a first embodiment (a planarization apparatus) of a processing apparatus according to the present invention.

Wide-bandgap semiconductors targeted in the present invention are single crystals (work pieces), such as SiC, GaN, AlGaN, AlN, and other semiconductors. 4H-SiC has a bandgap of 3.3 eV, GaN has a bandgap of 3.4 eV, AlGaN has a bandgap of 3.4 to 6.2 eV, and AlN has a bandgap of 6.2 eV. The forms of the work piece may be in a form of a wafer (a substrate) used for fabricating semiconductor devices including power electronic devices, or may be in a form of a block used for various precision components.

The processing method for a wide-bandgap semiconductor substrate according to the present invention is a processing method, in which a single crystal, which is SiC, GaN, AlGaN, or AlN, is a work piece, and the surface of the work piece is planarized or processed into an arbitrary curved surface using no abrasive grain or no abrasive. The processing method includes: using a catalytic substance having a function of promoting direct hydrolysis of the work piece or promoting hydrolysis of an oxide film on the surface of the work piece as a processing reference plane; in the presence of water, bringing the work piece into contact with or extremely close to the processing reference plane at a predetermined pressure and relatively moving the work piece and the processing reference plane to each other; by a catalyst function of the processing reference plane, advancing a process of direct hydrolysis of the surface of the work piece or a process of oxidation of the surface of the work piece and hydrolysis of the oxide film in priority from a projection on the surface close to the processing reference plane; and removing a decomposition product. In the present invention, planarization is equivalent to a process commonly referred to as mirror polishing. In the present invention, Water-CARE is a wide concept including a processing liquid mixed with at least one kind of a pH regulator, a buffer solution, or a complex solution that assists the dissolution of a decomposition product, other than pure water or ultrapure water. Of course, ideally, CARE is literally processing with only water, using only pure water, ultrapure water, or a neutral processing liquid.

The processing reference plane is prepared using a catalytic substance having a function of promoting direct hydrolysis of the work piece, such as an SiC substrate and a GaN substrate, or promoting hydrolysis of an oxide film on the surface of the work piece ($SiO_2$, $Ga_2O_3$, or the like). The processing reference plane is literally a reference plane for processing. Thus, the shape of the processing reference plane should not be changed in processing. The state of the surface of the processing reference plane is transferred to the surface of the work piece. Thus, the processing reference plane is desirably formed in such a manner that its surface roughness is as small as possible and its flatness is high. The relative motion of the processing reference plane to the work piece levels the surface roughness and flatness of the processing reference plane. Thus, the surface of the work piece has a surface more precise than the processing reference plane. The processing reference plane may have grooves in a radial, concentric circle, or spiral pattern, or in other patterns. A large number of through holes may be opened on the processing reference plane for applying ultraviolet rays to the surface of the work piece.

A processing method according to the present invention is a processing method, in which, using a catalytic substance that promotes both of the oxidation of a work piece and the hydrolysis of an oxide film, the surface of the work piece in contact with the catalytic substance is oxidized, a water molecule is dissociated to cut back-bonding between an oxygen element and the other element forming an oxide film, and adsorbed to the elements, and decomposition products produced by hydrolysis are eluted in water. In this processing, the catalyst potential is controlled, allowing the processing speed to be controlled in a wide range. When the processing reference plane is formed flat, e.g. in a disk shape, planarization can be performed. When the processing reference plane is formed in a spherical shape or a ring shape, a curved surface can be processed. Here, processes commonly referred to as polishing and cleaning are also included in the category of processing according to the present invention. In other words, polishing corresponds to planarization, and cleaning corresponds to processing for trace amounts, in which impurities or foreign substances are removed from the surface at the minimum amount of processing.

For the catalytic substance, the surface of a catalytic substance is preferably used, in which a metallic element is contained and a d orbital of an electron of the metallic element is near Fermi level. In the present invention, a solution, such as HF, having a reactivity to a metallic element is not used, and various metallic elements can be used. However, among others, a transition metallic element, which is hard and has a stable shape, is particularly preferable. Pd, Ru, Ni, Co, Cr, Mo, and other elements, including Pt having a large work function, can be used. The catalytic substance to be the processing reference plane may be a simple substance of a metallic element or may be an alloy made of a plurality of metallic elements. These metals are conductive. However, an insulating catalytic substance that is a compound containing a metallic element can be excellently used, as long as the catalytic substance has the d orbital of the electron of the metallic element near Fermi level. In this case, the potential of the processing reference plane remains at a rest potential.

For other examples of the catalytic substance, carbon materials, such as graphite or graphene, whose processing speed is slow, can also be used. The catalytic substance used as the processing reference plane is exposed to water, an acid solution, or a basic solution. Thus, a catalytic substance having a stable surface state is preferable.

The processing reference plane is literally a reference plane for processing. Thus, the shape of the processing reference plane should not be changed in processing. The state of the surface of the processing reference plane is transferred to the surface of the work piece. Thus, the processing reference plane is desirably formed in such a manner that its surface roughness is as small as possible and its flatness is high. However, because a processing liquid needs to penetrate to the interface of the processing reference plane and the work piece, it is not preferable to bring the processing reference plane into intimate contact to the work piece in the entire surfaces. The relative motion of the processing reference plane to the work piece levels the surface roughness and flatness of the processing reference plane. Thus, the surface of the work piece has a surface more precise than the processing reference plane. In the case in which the processing reference plane is formed of a conductive catalytic substance, the potential of the surface can be externally controlled. Here, the catalytic substance is not necessarily a bulk. The catalytic substance may be a thin film formed of a metal or transition metal. The metal or transition metal is formed on the surface of a base material, which is inexpensive and has excellent shape stability, by vapor deposition, sputtering, electroplating, and other methods. The base material having a film of the catalytic substance on its surface may be a hard elastic material. For example, a fluorine-based rubber material can be used. A material can be used as the processing reference plane, in which an SiC substrate, which is highly precisely planarized, is heated at a high temperature, and graphene in a plurality of layers is formed on the surface of the SiC substrate by thermal decomposition.

In order to achieve a pure processing environment and precise control on processing conditions, for the water, it is necessary to use pure water or ultrapure water having few impurities and constant properties. Typically, pure water has an electric resistivity of about 1 to 10 MΩ·cm, and ultrapure water has an electric resistivity of 15 MΩ·cm or more. However, they have no boundary between them. In the present invention, it is sometimes preferable to use hydrogen water obtained by purging hydrogen for pure water or ultrapure water, and to perform processing, with hydrogen being adsorbed to the catalytic substance of the processing reference plane. Alternatively, for the water, a mixture is preferably used, in which a complex to assist the dissolution of decomposition products is mixed in pure water or ultrapure water. Here, the complex has an action that promotes the dissolution of decomposition products and generates complex ions to maintain the stability in water. It is preferable to adjust a pH of the water (processing liquid) to a range of 2 to 12. When the pH is either smaller (strongly acidic) or larger (strongly alkaline) than the range above, the processing speed is decreased. The nature of the oxide film to be processed is diverse, and decomposition products produced in processing are also diverse. Thus, pH is desirably adjusted accordingly.

For example, pH is adjusted by adding $HNO_3$ in an acidic area, and KOH in an alkaline area. Of course, a processing liquid at pH 7 (neutral, water as it is) can be used. In this case, such a processing liquid is applicable to various oxide films for a general purpose.

Phenomenologically, a processing mechanism according to the present invention is as follows. The processing reference plane having at least on its surface a catalytic substance, in which the d orbital of the electron is near Fermi level, is brought into contact with or extremely close to the surface of the work piece. This means that the d orbital of the electron approaches the vicinity of the surface of the work piece. The d electrons act to reduce obstacles in reactions to both phenomena, the dissociation of water molecules and loose back-bonding of the oxide film. The principle is phenomenologically described as follows. When the catalytic substance approaches the oxide film, the binding force of back-bonding between the oxygen element and the other element forming the oxide film becomes weak, a water molecule is dissociated to cut back-bonding between the oxygen element and the other element of the oxide film, and adsorbed to the elements, generating decomposition products caused by hydrolysis. In addition, when the catalytic substance approaches the surface of the work piece, a phenomenon also occurs, in which the surface is directly hydrolyzed, and then, the decomposition products produced by hydrolysis are eluted in the processing liquid. Here, the processing reference plane having a catalytic substance is brought into contact with the surface of the work piece for rubbing the surface. Thus, mechanical force is applied to the decomposition products to promote elution into water. The flow of water caused by relative motion between the surface of the solid oxide film and the processing reference plane promotes the elution of decomposition products into water, even though the surface of the solid oxide film is not in contact with the processing reference plane.

When the catalytic substance forming the processing reference plane is a conductive material, adjusting the potential of the catalytic substance allows the processing speed to be controlled. The oxidation-reduction potential changes the nature of the surface of a conductive substance (e.g. Pt) to "pull" electrons out of the oxide film side or "give" electrons to the oxide film side. The potential of the conductive substance is a parameter for optimizing the processing speed according to finally desired accuracy. However, when the potential of the conductive substance is adjusted to a large positive potential, $O_2$ is produced, whereas when it is adjusted to a large negative potential, $H_2$ is produced. Consequently, bubbles become an obstacle to processing. Thus, it is necessary to adjust the potential of the conductive substance in a range in which neither $H_2$ nor $O_2$ is produced. The control range of the potential is about 1.6 V.

In processing SiC, for example, the Si—O—Si bond of the oxide film ($SiO_2$) formed on the surface is dissociated by hydrolysis of $H_2O$, forming Si—OH and OH—Si. As described above, silicic acid $\{[SiOx(OH)_{4-2x}]_n\}$, where $0<x<2$, is produced as decomposition products by hydrolysis. These decomposition products are eluted in water.

Next, the present invention will be described more in detail, based on embodiments shown in the accompanying drawings. A processing apparatus A according to a first embodiment illustrated in FIG. 1 has a structure that performs processing with a work piece and a processing reference plane being immersed in water. The processing apparatus A includes a container 2 that holds water 1, a processing pad 4 provided with a processing reference plane 3 having a catalytic substance at least on its surface and disposed in the container 2 with the processing reference plane 3 being immersed in the water 1, a work piece holder 6 disposed in the container 2 to hold and immerse the work piece 5 in the water 1 with the work piece 5 being brought into contact with or extremely close to the processing reference plane 3, a driving mechanism 7 that relatively moves the processing pad 4 and the work piece holder 6 to each other with the processing pad 4 being brought into contact with or extremely close to the work piece holder 6, and a voltage applying unit 8 that adjusts the potential of the catalytic substance forming the processing reference plane 3 within a predetermined range. In the processing apparatus A, a water molecule is dissociated to cut back-bonding between an oxygen element and the other element forming a solid oxide film, and adsorbed to the elements, and decomposition products caused by hydrolysis are eluted in water for processing the surface of the work piece. The processing apparatus A also includes a water circulation system 9 that cleans the water 1 in the container 2 for keeping constant water level. The water circulation system 9 is configured of a supply pipe 9A and a drain pipe 9B and a processing liquid purification unit, a buffer tank, a pump, and other components, not illustrated.

In the processing apparatus A illustrated, the processing pad 4 is a disk-like rotating platen. The processing pad 4 rotates the work piece holder 6 holding the work piece 5 in an area smaller than the area of the platen and the processing pad 4 in parallel with each other on an off-centered rotating axis at a predetermined speed. The work piece holder 6 can adjust the contact pressure of the work piece 5 to the processing reference plane 3 by adjusting a load. It is desirable to provide a built-in temperature control function on the processing pad 4 or the work piece holder 6 because the processing temperature can be constantly maintained at a predetermined temperature. When the processing reference plane 3 is made narrower than the surface of the work piece 5, the position and dwell time of the small processing pad 4 to the surface of the work piece 5 are controlled to regulate the local processing amount of the surface of the work piece 5. In other words, local processing can be performed by numerical control.

Figure 2:
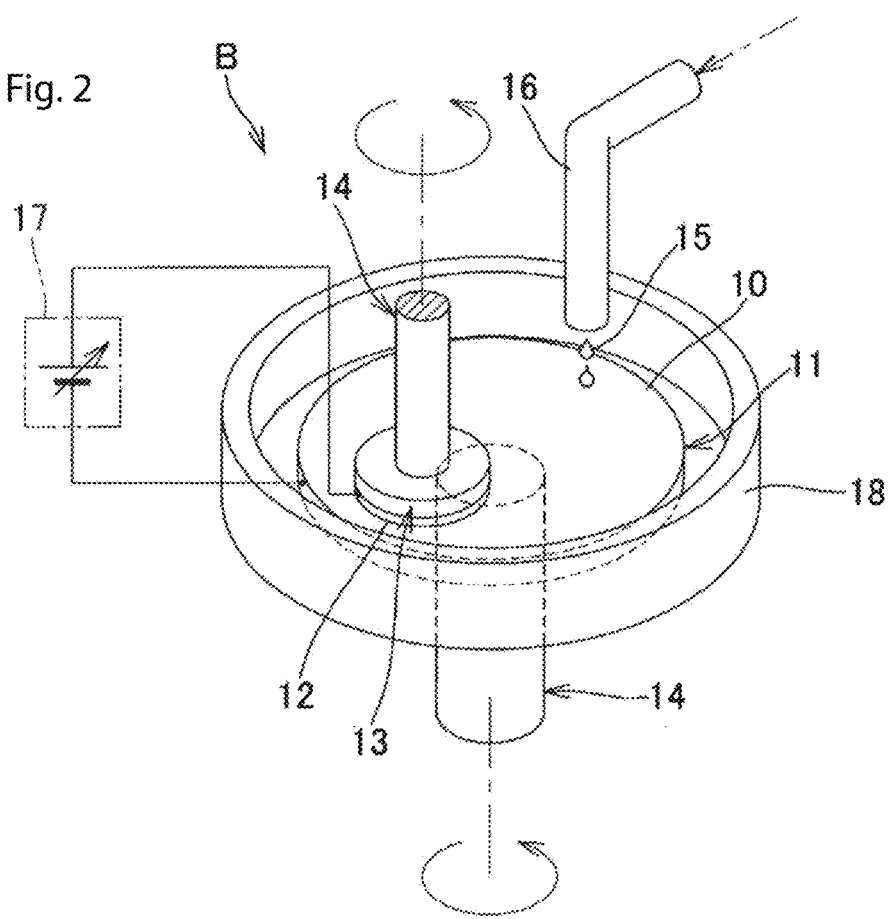
FIG. 2 is a schematic perspective view illustrating a second embodiment (a planarization apparatus) of a processing apparatus according to the present invention.

A processing apparatus B according to a second embodiment illustrated in FIG. 2 has a structure in which processing is performed with water dripping between a work piece and a processing reference plane being supplied. The processing apparatus B includes a processing pad 11 provided with a processing reference plane 10 having a catalytic substance at least on its surface, a work piece holder 13 that holds a work piece 12 facing the processing reference plane 10, a driving mechanism 14 that relatively moves the processing reference plane 10 of the processing pad 11 and the work piece 12 held on the work piece holder 13 to each other with the processing reference plane 10 being brought into contact with or extremely close to the work piece 12, a water supplying unit 16 that supplies water 15 between the processing reference plane 10 of the processing pad 11 and the work piece 12 held on the work piece holder 13, and a voltage applying unit 17 that adjusts the potential of the catalytic substance forming the processing reference plane 10 within a predetermined range. In the processing apparatus B, a water molecule is dissociated to cut back-bonding between an oxygen element and the other element forming a solid oxide film, and adsorbed to the elements, and decomposition products caused by hydrolysis are eluted in water for processing the surface of the work piece. Here, a container 18 is provided around the processing pad 11 in order to prevent the water from scattering.

Similarly to the above described processing apparatus A, the processing apparatus B can also be configured to smooth the flat surface as well as process the arbitrary curved surface by numerical control. A configuration is also preferable, in which excitation light at a specific wavelength is applied to the surface of the work piece for processing, with the surface being activated.

Figure 3:
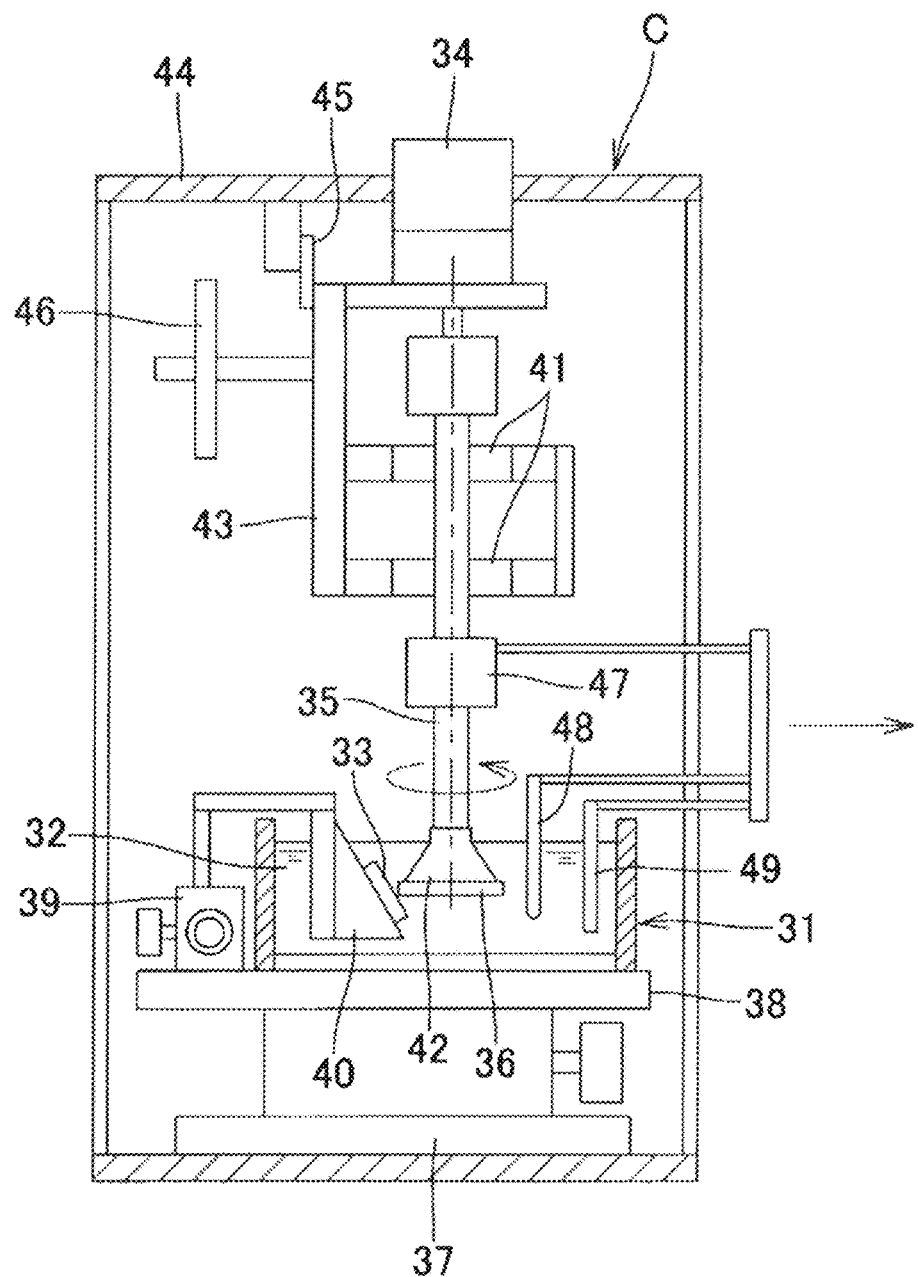
FIG. 3 is a schematic cross sectional view illustrating a third embodiment (a local processing apparatus) of a processing apparatus according to the present invention.

FIG. 3 illustrates a local processing apparatus C, which is an apparatus that can theoretically process the arbitrary curved surface by numerical control. This apparatus does not aim for planarization. The apparatus processes only a part of the region of the work piece by bringing the catalytic substance into contact with the surface of the work piece, with the rotor of the catalytic substance being rotated.

The local processing apparatus C is an apparatus in which a work piece 33 is held in pure water 32 stored in a water tank 31, and a catalytic substance ball 36 mounted on the tip end of a vertical rotating shaft 35 joined to a stepping motor 34 is rotated in contact with the surface of the work piece 33 in water at a constant contact pressure for processing. More specifically, the water tank 31 and an XY-stage 39 are fixed on a horizontal plate 38 disposed on a Z-stage 37, and a work piece holder 40 driven by the XY-stage 39 extends to the inside of the water tank 31 to hold the work piece 33. In order to minimize runout, the rotating shaft 35 is fixed by double bearings 41 and 41. The connecting portion of the rotating shaft 35 to a head 42 that mounts the catalytic substance ball 36 is tapered. Thus, positional displacement, which occurs every time when attaching and detaching the head 42, is reduced. For the catalytic substance ball 36, an O-ring was used, in which a film of a predetermined catalytic substance is formed on the surface of the O-ring. For the O-ring, a fluorine rubber O-ring in a P44 standard size (the outer diameter was 50.7 mm and the thickness was 3.5 mm) was used. The stepping motor 34, the rotating shaft 35, and the bearings 41 and 41 are all mounted on a vertical panel 43. The top end of the vertical panel 43 is joined to a frame 44 through a plate spring 45, and the perpendicularity of the rotating shaft 35 is adjusted by a balance balancer 46.

The work piece 33 can be moved in a given amount in the direction of the catalytic substance ball 36 by operating the X-stage. The contact pressure between the surface of the work piece 33 and the catalytic substance ball 36 can be adjusted by controlling the amount of movement of the rotating shaft 35 using an electrical micrometer. A catalytic metal on the catalytic substance ball 36 is electrically connected to a potentiostat through a rotary joint 47 to form a three-electrode cell for potential control. In the present invention, it is necessary to highly precisely control the potential of the catalytic metal. In the water tank 31, the catalytic substance ball 36 is disposed as a working electrode, and a reference electrode 48 and a counter electrode 49 are disposed. These three electrodes are combined with the potentiostat to form the three-electrode cell. Most of an electric current is carried to the counter electrode 49, and an electric current in a micro amount is carried to the reference electrode 48, determining the potential of the working electrode (the catalytic substance ball 36). In determining the potential, the potential is automatically controlled using a potentiostat, not illustrated. For the reference electrode 48, a silver-silver chloride electrode was adopted.

The local processing apparatus C illustrated in FIG. 3 is a numerical control (NC) processing apparatus that drives the stages by numerical control to change the relative position between the work piece 33 and the catalytic substance ball 36 to move unit processed marks, allowing the creation of an arbitrary curved surface having a curvature smaller than the curvature of the catalytic substance ball 36.

Example 1

Next, FIG. 4(a), FIG. 4(b), FIG. 5(a), FIG. 5(b), FIG. 5(c), FIG. 5(d), FIG. 6(a), FIG. 6(b), FIG. 6(c), FIG. 6(d), FIG. 6(e), FIG. 7(a), FIG. 7(b), FIG. 7(c), FIG. 7(d), FIG. 8(a) FIG. 8(b), FIG. 8(c), FIG. 8(d), FIG. 8(e), FIG. 8(f), FIG. 9(a), FIG. 9(b), FIG. 9(c) and FIG. 9(d) show the result of experimentally processing of SiC and GaN by the processing apparatus A using Pt as a catalytic substance forming a processing reference plane. For the processing reference plane, a rubber pad was used, in which a Pt film in a thickness of 100 nm was formed on the surface of the rubber pad, and the rubber pad was held on the surface of the rotating platen. The potential of the catalyst was not adjusted and processing was all performed at a rest potential. Surfaces before and after planarization were observed using a phase shift interference microscope (NewView made by Zygo Corporation) and an atomic force microscope (AFM), and the processing characteristics were evaluated.

FIG. 4(a) and FIG. 4(b) show experimental processing using a two-inch n-type 4H-SiC (0001) on-axis wafer. In the processing conditions, the catalyst was Pt, the processing liquid was ultrapure water, the processing pressure was 400 hPa, and the rotational speed was 10 rpm. FIG. 4(a) is an AFM image before planarization, and FIG. 4(b) is an AFM image after planarization. Change is clearly observed in the state of the surface before and after planarization. After planarization, a step terrace structure was clearly confirmed on the SiC substrate. This result shows that the SiC substrate can be processed by Water-CARE. The processing speed in this case was about 3 nm/h.

FIG. 5(a), FIG. 5(b), FIG. 5(c) and FIG. 5(d) show experimental processing using a three-inch n-type 4H-SiC (0001) 4-degree-off epitaxial wafer. In the processing conditions, the catalyst was Pt, the processing liquid was ultrapure water, the processing pressure was 900 hPa, and the rotational speed was 30 rpm. FIG. 5(a) is an AFM image before planarization. FIG. 5(b) is an AFM image after planarization for one minute. FIG. 5(c) is an AFM image after planarization for two minutes. FIG. 5(d) is an AFM image after planarization for three minutes. From the images, the surface roughness before planarization was an rms of 0.218 nm. The surface roughness after planarization for three minutes was an rms of 0.055 nm, showing a great improvement. Here, the term "rms" means root-mean-square roughness. In JIS, rms is expressed by Rq. On the epitaxial wafer, step bunching is produced through process steps including epitaxial growth and heat treatment after planarization, again degrading the flatness as in FIG. 5(a). However, it is difficult to apply previously existing polishing methods using abrasive grains to these device processes. In the present invention, step bunching was successfully fully removed by planarization for three minutes. In the device processes, the present invention is applicable to the removal of bunching after epitaxial growth to a sufficient degree also in processing efficiency under present circumstances.

Figure 6:
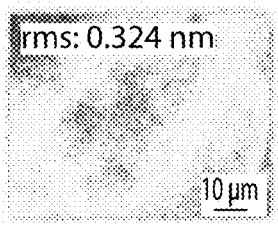
FIG. 6(a), FIG. 6(b), FIG. 6(c), FIG. 6(d) and FIG. 6(e) are changes in the state of the surface of a GaN substrate in planarization.
Figure 6:
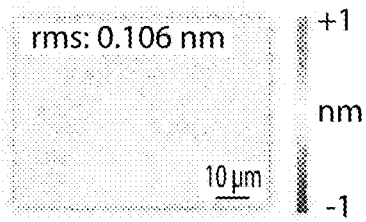
Figure 6:
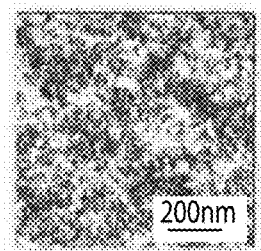
Figure 6:
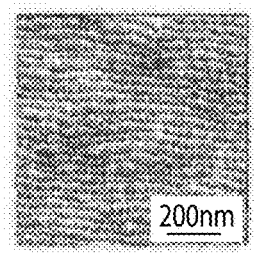
Figure 6:
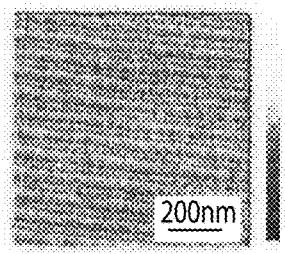

FIG. 6(a), FIG. 6(b), FIG. 6(c), FIG. 6(d) and FIG. 6(e) show experimental processing using a two-inch n-type GaN (0001) wafer. In the processing conditions, the catalyst was Pt, the processing liquid was pure water, the processing pressure was 400 hPa, and the rotational speed was 10 rpm. FIG. 6(a) is a phase shift interference microscope image before planarization. FIG. 6(b) is a phase shift interference microscope image after planarization for 60 minutes. FIG. 6(c) is an AFM image before planarization. FIG. 6(d) is an AFM image after planarization for 30 minutes. FIG. 6(e) is an AFM image after planarization for 60 minutes. Before planarization, the surface roughness was an rms of 0.324 nm. After planarization, the surface roughness was improved to an rms of 0.106 nm. A step terrace structure is observed from the AFM images, obtaining atomically a flat surface. However, the processing speed is prone to drop from 30 nm/h to less than 1 nm/h as processing proceeds.

FIG. 7(a), FIG. 7(b), FIG. 7(c), FIG. 7(d), FIG. 8(a), FIG. 8(b), FIG. 8(c), FIG. 8(d), FIG. 8(e), FIG. 8(f), FIG. 9(a), FIG. 9(b), FIG. 9(c) and FIG. 9(d) show results, in which a two-inch n-type GaN (0001) wafer was used, coarse processing was first performed by PEC-CARE assisted by ultraviolet ray application, and then finishing planarization was performed by Water-CARE. Here, the term "PEC" means Photo-electrochemical. First, in the processing conditions of PEC-CARE, the catalyst was Pt, the processing liquid was a phosphate buffer at pH 7, the processing pressure was 200 hPa, and the rotational speed was 10 rpm. For ultraviolet ray application, a structure was adopted, in which a Hg—Xe lamp (a wavelength of 365 nm at about 3.4 eV) was disposed below a rotating platen made of quartz glass, and a rubber pad having a Pt film and formed with a large number of through holes was held on the platen. Ultraviolet rays were applied to the surface of the GaN substrate through the quartz glass and through holes on the pad.

Figure 7:
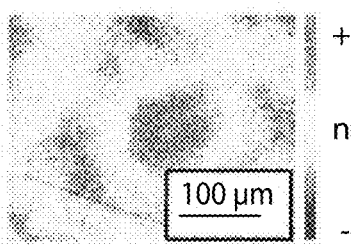
FIG. 7(a), FIG. 7(b), FIG. 7(c) and FIG. 7(d) are states of the surface of a GaN substrate before planarization.
Figure 7:
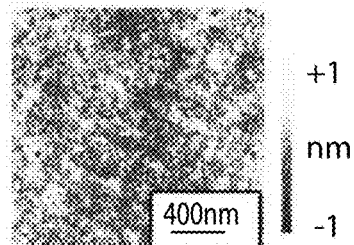
Figure 7:
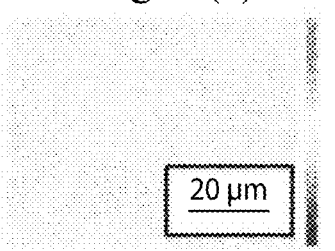
Figure 7:
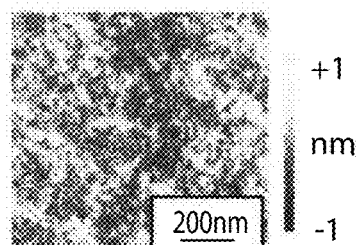
Figure 8A:
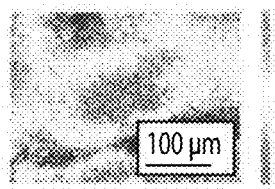
FIG. 8(a), FIG. 8(b), FIG. 8(c), FIG. 8(d), FIG. 8(e) and FIG. 8(f) are changes in the state of the surface of the GaN substrate in FIG. 7 in planarization with ultraviolet ray application.
Figure 8C:
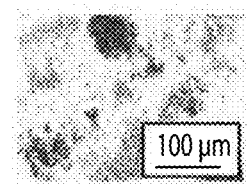
Figure 8E:
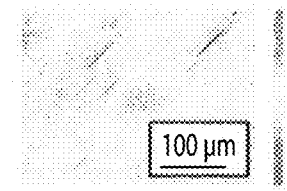
Figure 8B:
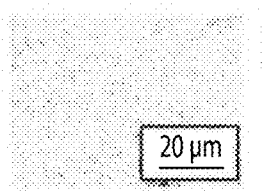
Figure 8D:
Figure 8F:
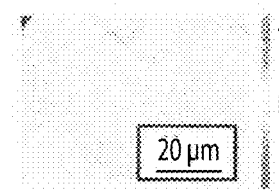

FIG. 7(a), FIG. 7(b), FIG. 7(c) and FIG. 7(d) show the states of the surface of the GaN substrate before planarization. FIGS. 7(a) and 7(b) are phase shift interference microscope images. FIGS. 7(c) and 7(d) are AFM images. The scales are different between the upper images and the lower images. In the AFM images, no step terrace structure is observed. FIG. 8 shows changes in the surface of the GaN substrate processed by PEC-CARE, with a lapse of processing time. FIGS. 8(a) and 8(b) are phase shift interference microscope images after planarization for 30 minutes. FIGS. 8(c) and 8(d) are phase shift interference microscope images after planarization for 60 minutes. FIGS. 8(e) and 8(f) are phase shift interference microscope images after planarization for 90 minutes. As illustrated in FIGS. 8(c) and 8(d), damaged forms were observed, which were considered to be caused by the influence of affected layers. As illustrated in FIGS. 8(e) and 8(f), the damaged parts were removed after processing was continued. However, forms caused by crystallizability were observed.

Figure 9A:
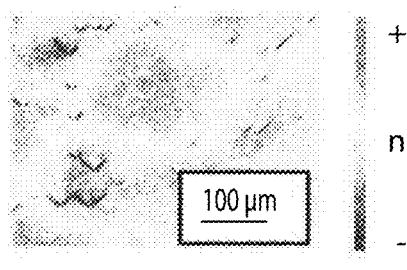
FIG. 9(a), FIG. 9(b), FIG. 9(c) and FIG. 9(d) are states of the surface of the GaN substrate in FIG. 7 after planarization.
Figure 9C:
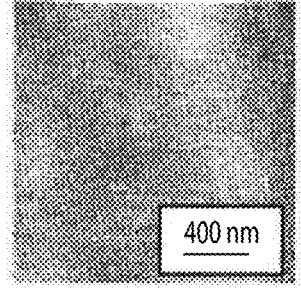
Figure 9B:
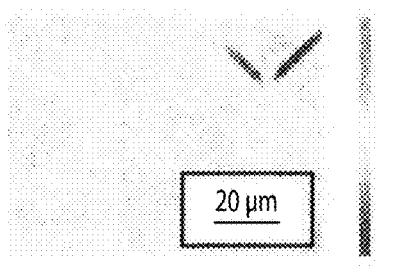
Figure 9D:
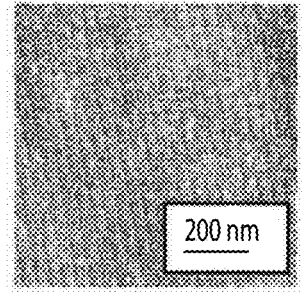

FIG. 9(a), FIG. 9(b), FIG. 9(c) and FIG. 9(d) show the result, in which finishing planarization was performed by Water-CARE. FIGS. 9(a) and 9(b) are phase shift interference microscope images after planarization for 120 minutes. FIGS. 9(c) and 9(d) are AFM images after planarization for 120 minutes. The scales are different between the upper images and the lower images. In the processing conditions of Water-CARE, the catalyst was Pt, the processing liquid was pure water, the processing pressure was 200 hPa, and the rotational speed was 10 rpm. A step terrace structure is observed on the surface of the GaN substrate after planarization by Water-CARE, showing that a flat surface at atom level is obtained.

Figure 10:
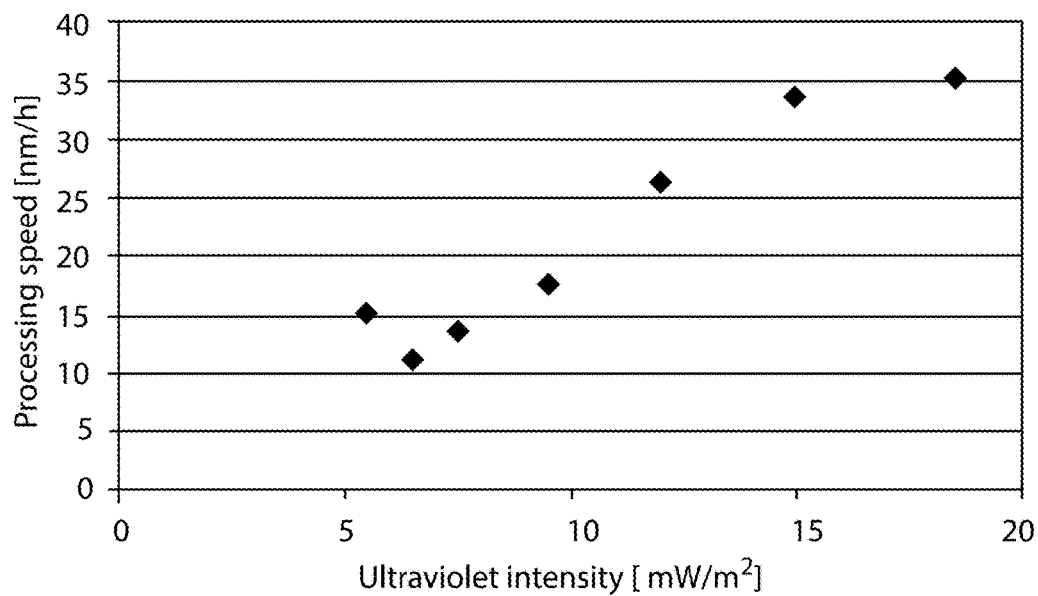
FIG. 10 is a graph illustrating the relationship between ultraviolet intensity and processing speed.

By ultraviolet ray application with energy higher than the energy of the bandgap, electrons near the surface of the work piece are increased from the valence band to the conduction band to generate holes in pairs, and the holes are involved in oxidation. The oxide film is then etched. In the GaN substrate, the oxide film is made of $Ga_2O_3$. However, this oxide film is not eluted in a neutral solution. Thus, the oxide film is removed by hydrolysis from the topmost layer of the oxide film in contact with the catalyst processing reference plane. The oxidation of the work piece is promoted by ultraviolet ray application, increasing the processing speed. However, the oxidation is uniform oxidation, which does not contribute to smoothing processes. FIG. 10 shows the relationship between ultraviolet intensity and processing speed on the GaN substrate by PEC-CARE, showing a tendency in which the processing speed is accelerated as ultraviolet intensity is increased. It is considered that the processing speed of the SiC substrate and the GaN substrate is increased by about one digit by ultraviolet ray application.

In these processing tests, it was demonstrated that a hard-to-work material, such as SiC and GaN, is planarized in a sufficient accuracy by the processing method and the processing apparatus according to the present invention. AlGaN and AlN, which are nitride similarly to GaN, can be processed in a similar manner. SiC in a crystal structure other than 4H-SiC can also be processed in a similar manner.

Example 2

Figure 11:
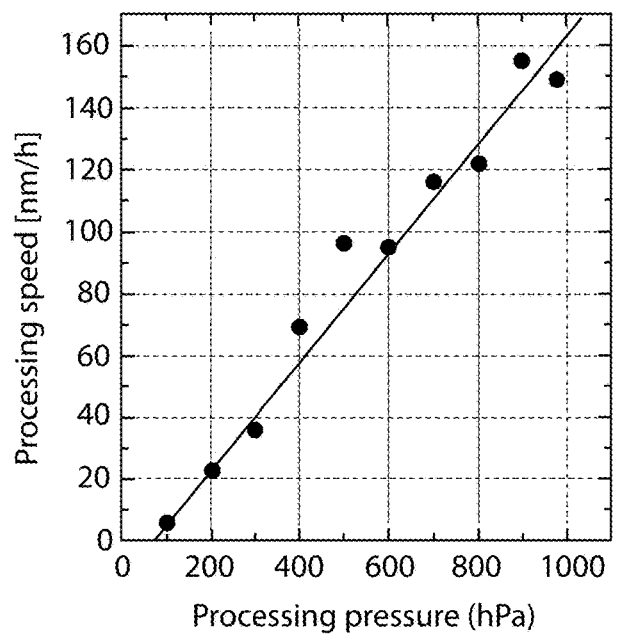
FIG. 11 is a graph illustrating the dependence of processing speed on a processing pressure.
Figure 12:
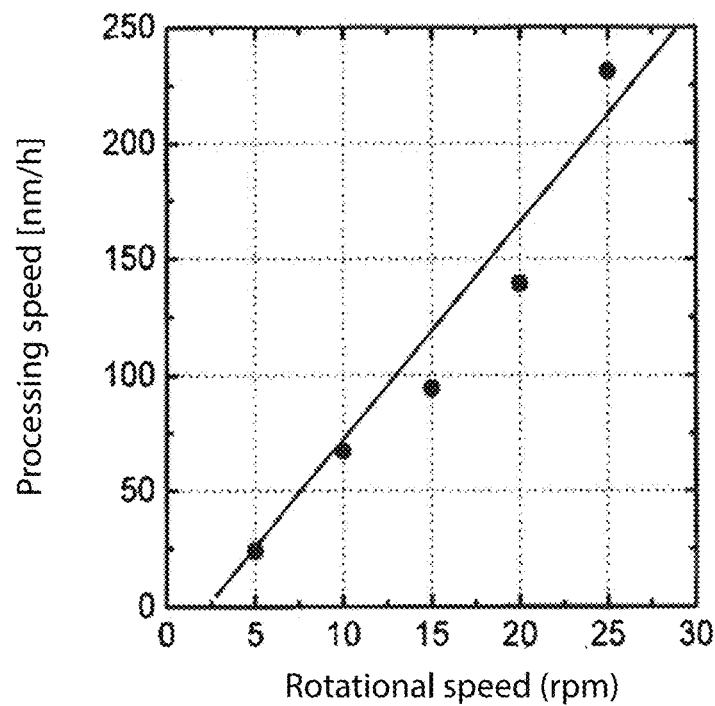
FIG. 12 is a graph illustrating the dependence of processing speed on rotational speed.

Next, the controllability of processing speed was checked using the local processing apparatus C. First, the dependence of the processing speed on the processing pressure and the dependence of the processing speed on the rotational speed were checked using a 4H-SiC substrate. FIG. 11 shows the dependence on the processing pressure. FIG. 12 shows the dependence on the rotational speed. The dependence on the processing pressure was checked under the processing conditions in which the catalyst was Pt, the processing liquid was pure water, the processing pressure was 100 to 1,000 hPa, and the rotational speed was 10 rpm. The dependence on the rotational speed was checked under the processing conditions in which the catalyst was Pt, the processing liquid was pure water, the processing pressure was 400 hPa, and the rotational speed was 5 to 25 rpm. The potential of Pt is a rest potential. Only an elliptic region, with which Pt was brought into contact, was processed. The maximum depth of the processed mark was defined as a processed amount, and then the processing speed was measured. These results show that the processing speed is increased in proportion to the processing pressure and the rotational speed. With the adjustment of the processing pressure and the rotational speed, the processing speed can be theoretically increased by one digit or more. However, although the processing speed depends on the circumferential velocity at a position at which the processing reference plane is brought into contact with the work piece, the rotational speed is treated as a parameter of the processing conditions for convenience because the characteristics are checked using the same processing apparatus. GaN is also presumed to have the dependence on the processing pressure and the dependence on the rotational speed, similarly to SiC.

Figure 13:
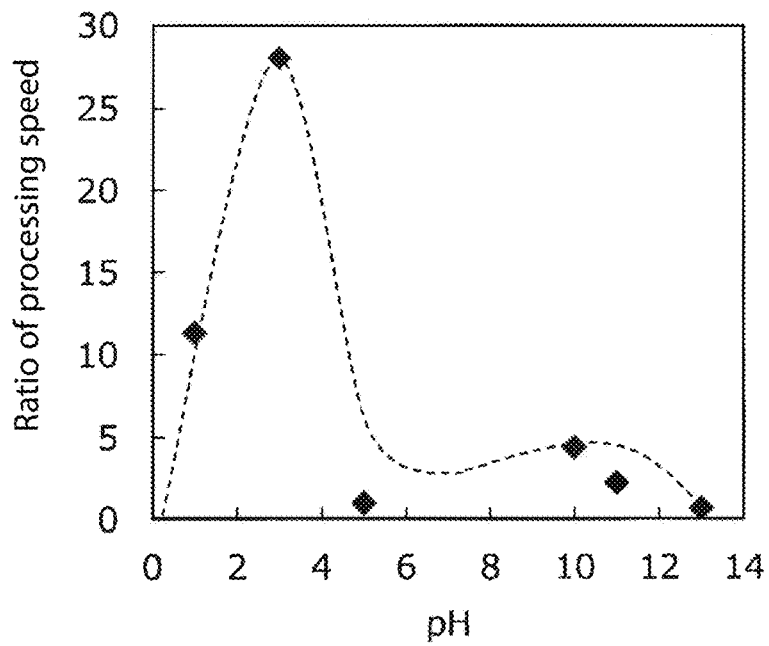
FIG. 13 is a graph illustrating the ratio of processing speed to the pH of a processing liquid.

Next, the dependence of the processing speed on the catalyst potential in the 4H-SiC substrate was checked using the local processing apparatus C, with solutions at pH 1 to 13. For the solutions, an aqueous $HNO_3$ solution, a phosphate buffer, and an aqueous KOH solution were used, and adjusted at pH 1 to 13. In the processing conditions, the catalyst was Pt, the processing liquid was pure water plus a pH regulator, the contact pressure was 2,000 hPa, and the rotational speed was 24 rpm. The processing time was 60 minutes. FIG. 13 shows the result in which the pH of the solution was changed to evaluate the processing speed. It was revealed that the maximum processing speed is reached when a weak acid is used and the processing speed is increased about four times the processing speed when pure water is used. A dotted line in FIG. 13 expresses the dependence of the processing speed on the pH of the solution in quartz glass. The processing speed is maximum when the acid solution is used, and the processing speed becomes smaller when the basic solution is used and further smaller when the neutral solution is used. According to the result, in the process of etching the oxide film, first, H atom is dissociated from $H_2O$ molecule by the action of the catalyst, and the produced hydroxyl group is adsorbed to Si atom, and H atom is subsequently adsorbed to O atom. However, it is considered that this H atom may be not only H atom on the catalyst, which has been dissociated from $H_2O$ molecule but also hydrogen ion in the solution. Thus, in the acid solution, the processing speed is high. Meanwhile, the processing speed in the basic solution is higher than the processing speed in the neutral solution. It is considered that this is because the solution velocity of Si(OH)x, which is a processed product, is reached at the maximum in the basic solution.

Figure 14:
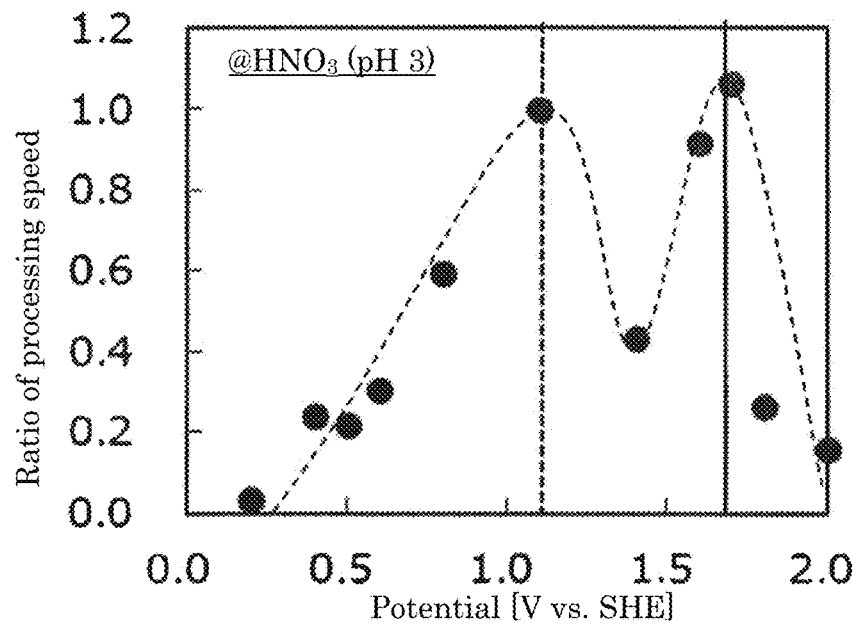
FIG. 14 is a graph illustrating the dependence of processing speed of a 4H-SiC substrate on a catalyst potential at pH 3 (aqueous $HNO_3$ solution).
Figure 15:
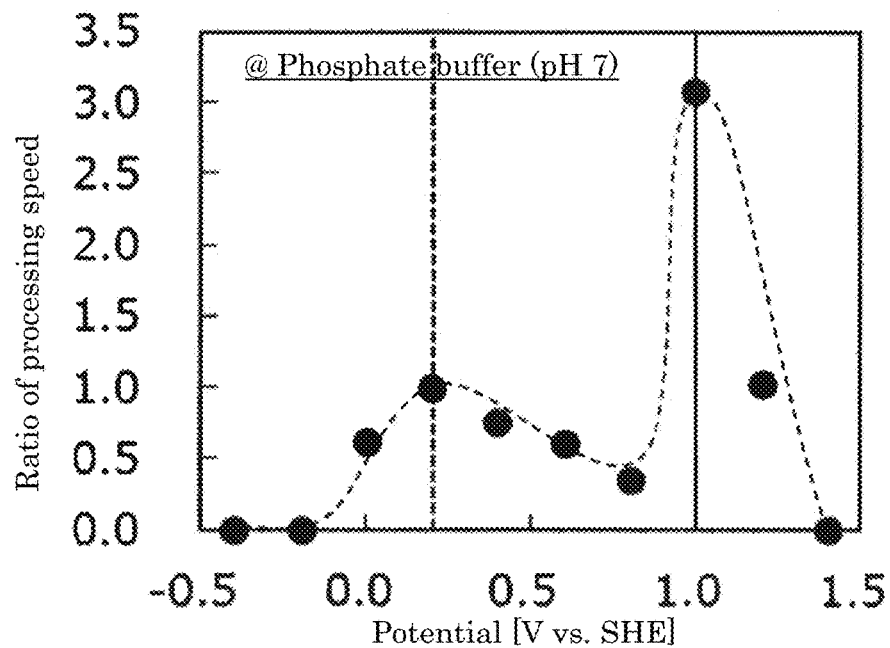
FIG. 15 is a graph illustrating the dependence of processing speed of a 4H-SiC substrate on a catalyst potential at pH 7 (phosphate buffer).
Figure 16:
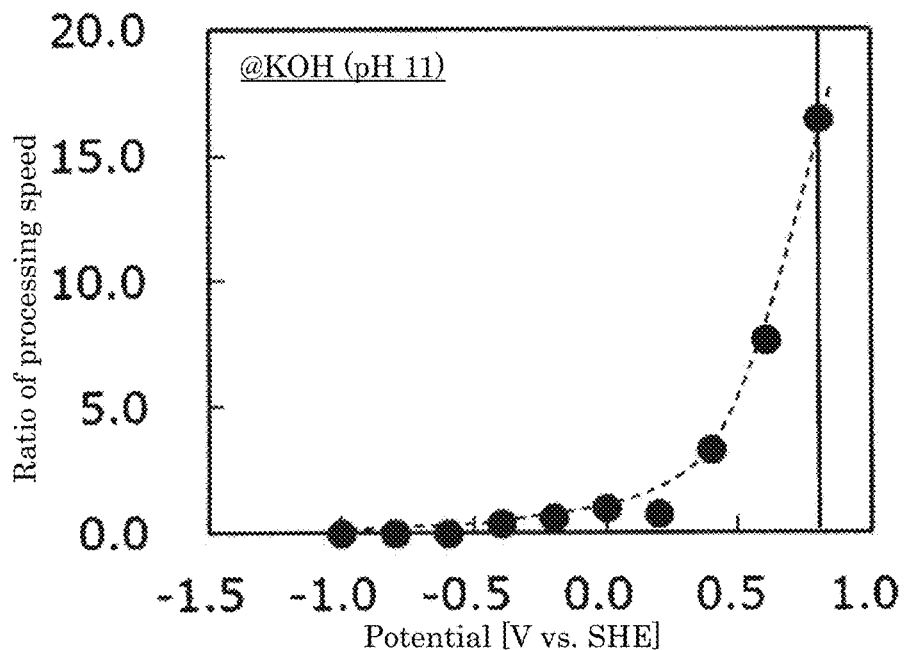
FIG. 16 is a graph illustrating the dependence of processing speed of a 4H-SiC substrate on a catalyst potential at pH 11 (aqueous KOH solution).
Figure 17:
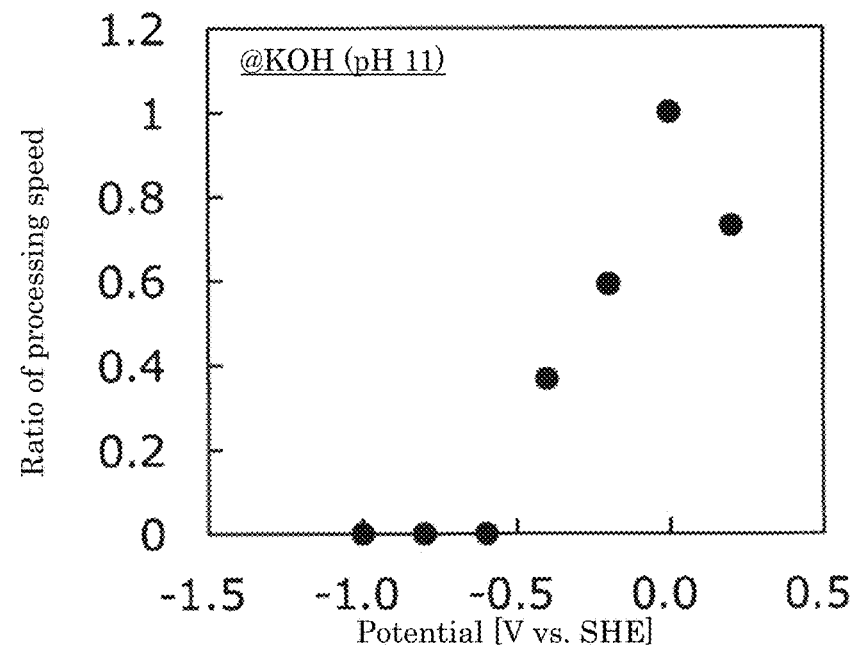
FIG. 17 is an enlarged graph of a part of FIG. 16.

When the processing solution is changed, the ion concentration in the solution as well as the surface potential of the catalyst are changed. Thus, FIGS. 14 to 16 show the results, in which only the potential was controlled in solutions at pH 3, 7, and 11, and the processing speed was evaluated. FIG. 14 is a graph illustrating the dependence of the processing speed on the catalyst potential in the 4H-SiC substrate at pH 3 (aqueous $HNO_3$ solution). FIG. 15 is a graph illustrating the dependence of the processing speed on the catalyst potential in the 4H-SiC substrate at pH 7 (phosphate buffer). FIG. 16 is a graph illustrating the dependence of the processing speed on the catalyst potential in the 4H-SiC substrate at pH 11 (aqueous KOH solution). FIG. 17 is an enlarged diagram of a part of FIG. 16. As a result, it was revealed that the processing speed is greatly changed depending on the catalyst potential also in the SiC substrate similarly to a metal oxide, such as quartz glass. This result shows that the processing speed can be controlled based on the catalyst potential. FIGS. 13 to 16 show that there are many points of similarities between processing the SiC substrate and processing quartz glass described in Patent Document 3. It can be said that processing proceeds by the dissociative adsorption of water to the surface of the oxide film of the SiC substrate, i.e. by selective elution of decomposition products caused by hydrolysis.

However, as shown in FIGS. 14 to 16, in the case of processing the SiC substrate, a sudden increase in the processing speed was observed after the catalyst potential exceeded the potential near the oxygen production potential. This can be assumed because the surface oxidation of the SiC substrate by the catalyst is greatly promoted in a range in which the catalyst potential exceeds the potential near the oxygen production potential. This point will be described later. However, it was found that two types of actions contribute to processing the SiC substrate; one is direct hydrolysis of the surface by the action of the catalyst, and the other is the surface oxidation by the action of the catalyst and the hydrolysis of the oxide film. In both cases, hydrolysis proceeds from projections on the surface of the work piece in contact with the processing reference plane. Thus, etching proceeds from projections on the surface similarly to previously existing CMP, achieving planarization. It is considered that the oxidation of the surface of the work piece by the catalyst also proceeds from projections on the surface in contact with the processing reference plane. This selective oxidative effect also achieves planarization.

Figure 18:
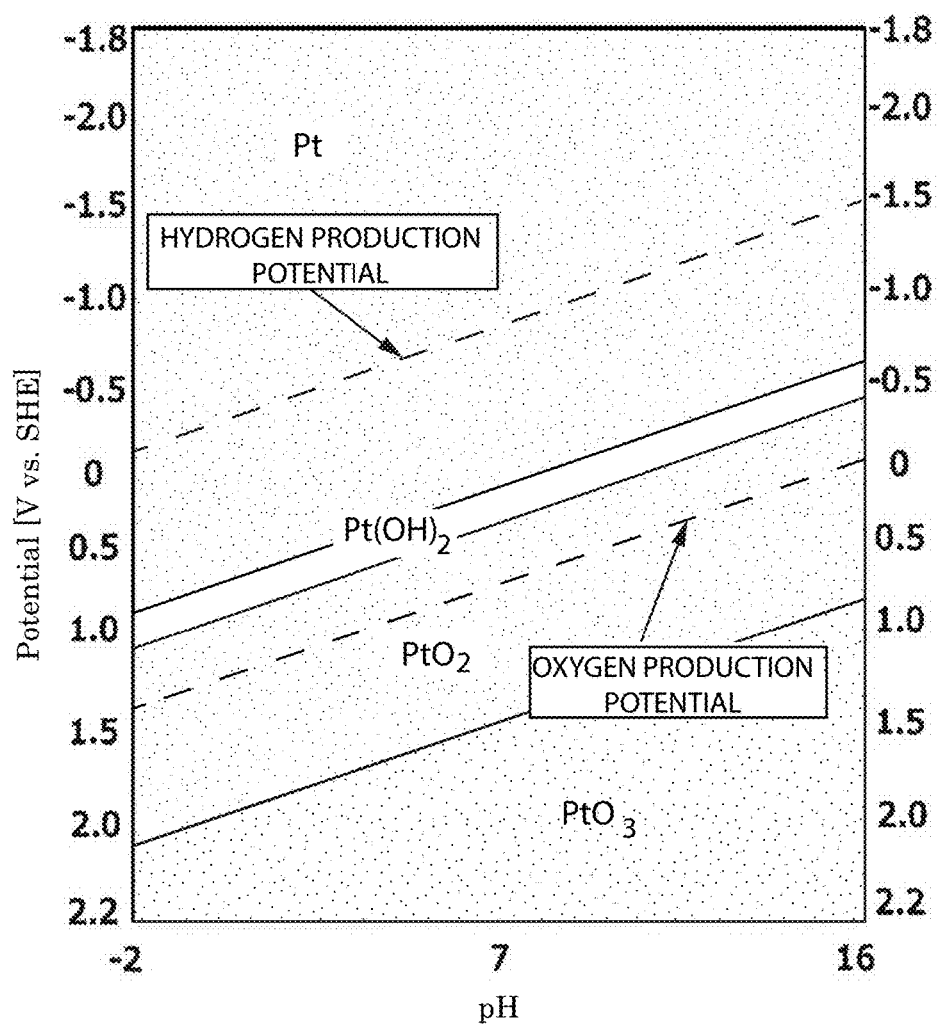
FIG. 18 is a potential/pH diagram (Pourbaix diagram) of Pt in water.

FIG. 18 is a potential/pH diagram (Pourbaix diagram) of Pt in water. Dotted lines express theoretical potentials at which hydrogen and oxygen are generated by electrolysis of water (the dotted line on the upper side expresses the hydrogen production potential, and the dotted line on the lower side expresses the oxygen production potential). At the production potentials of hydrogen and oxygen derived from the Nernst equation, the potential difference is 1.23 V, and the slopes of potentials of hydrogen and oxygen are −59 mV. A rest potential in each solutions is expressed by a white circle.

Figure 19:
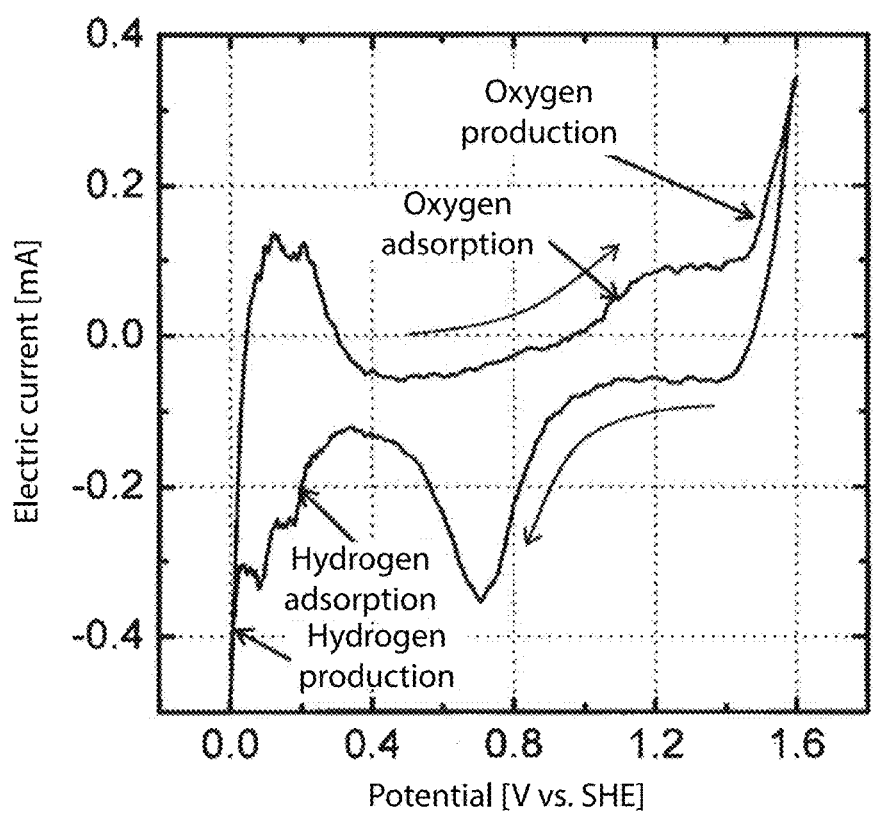
FIG. 19 shows cyclic voltammogram waveforms obtained at a potential scanning rate of 50 mV/s in sulfuric acid at pH 0 using a Pt electrode.

FIG. 19 shows cyclic voltammogram waveforms obtained at a potential scanning rate of 50 mV/s using a Pt electrode in sulfuric acid at pH 0.

An electric current response caused by hydrogen adsorption and hydrogen production can be confirmed by negatively scanning the potential, whereas an electric current response caused by production of the oxide film and production of oxygen can be confirmed by positively scanning the potential. These electric current responses show that the adsorption state of the surface of the electrode is changed by potential control.

Here, the oxygen production potential $E_{O2}$ (V) is expressed as below by the Nernst equation.

$$E_{O2}=1.23-0.059 \text{ pH} \quad \text{[Equation 1]}$$

The results in FIGS. 14 to 16 show that in processing the SiC substrate, the processing speed is decreased as the potential comes closer to the oxygen production potential and the hydrogen production potential. In the potential region between the oxygen production potential and the hydrogen production potential, no adsorption is observed on the Pt surface at the peak potential of the processing speed, showing that this corresponds to the state in which the bare surface is exposed. However, it is revealed that the processing speed has another peak after the oxygen production potential is exceeded, and the ratio of an increase in the processing speed is large as well. Specifically, in the solutions at pH 7 and pH 11, the processing speed after the oxygen production potential is exceeded is much greater than the peak of the processing speed in the potential region between the oxygen production potential and the hydrogen production potential. In FIGS. 14 to 16, the first peak is depicted by a dotted line, and the second peak is depicted by a solid line. However, in FIG. 16 at pH 11, a clear first peak is not observed.

The tendency of the SiC substrate can be confirmed in which even using the processing liquids at any pH, an increase in the surface potential of the catalyst improves the processing speed again, which is different from the tendency of the quartz glass substrate. As apparent from a cyclic voltammogram shown in FIG. 19, at the potential at which the processing speed is improved, the adsorption of atomic hydrogen proceeds. At a potential like this, it is predicted that the Pt surface is in an unstable oxidation state to promote oxidation reactions on the SiC surface. This tendency is confirmed on the SiC substrate, not on the quartz substrate, which is an oxide. This also suggests that oxidative effect contributes to improving the processing speed. In other words, it is considered that alternate formation and removal of the oxide film is one of the causes of the improvement of the processing speed.

In order to prove this, processing was performed, using Au as a catalyst, whose processing speed is considerably slow compared with Pt. A work piece is a 4H-SiC (0001) 4-degree-off substrate. In the processing conditions, the catalyst was Au, the processing liquid was nitric acid (pH 3), the contact pressure was 2,000 hPa, and the rotational speed was 24 rpm. The processing time was two hours in the open circuit of the voltage applying unit, and one hour at a voltage of 1.5 V (vs. SHE). In the case of the open circuit, processing failed to be confirmed. Meanwhile, in the case of applying a potential of 1.5 V (vs. SHE), the processing speed was 60 nm/h. From the results above, it can be said that the application of a potential slightly higher than the oxygen production potential causes the surface of the SiC substrate to be oxidized, improving the processing speed.

Figure 20:
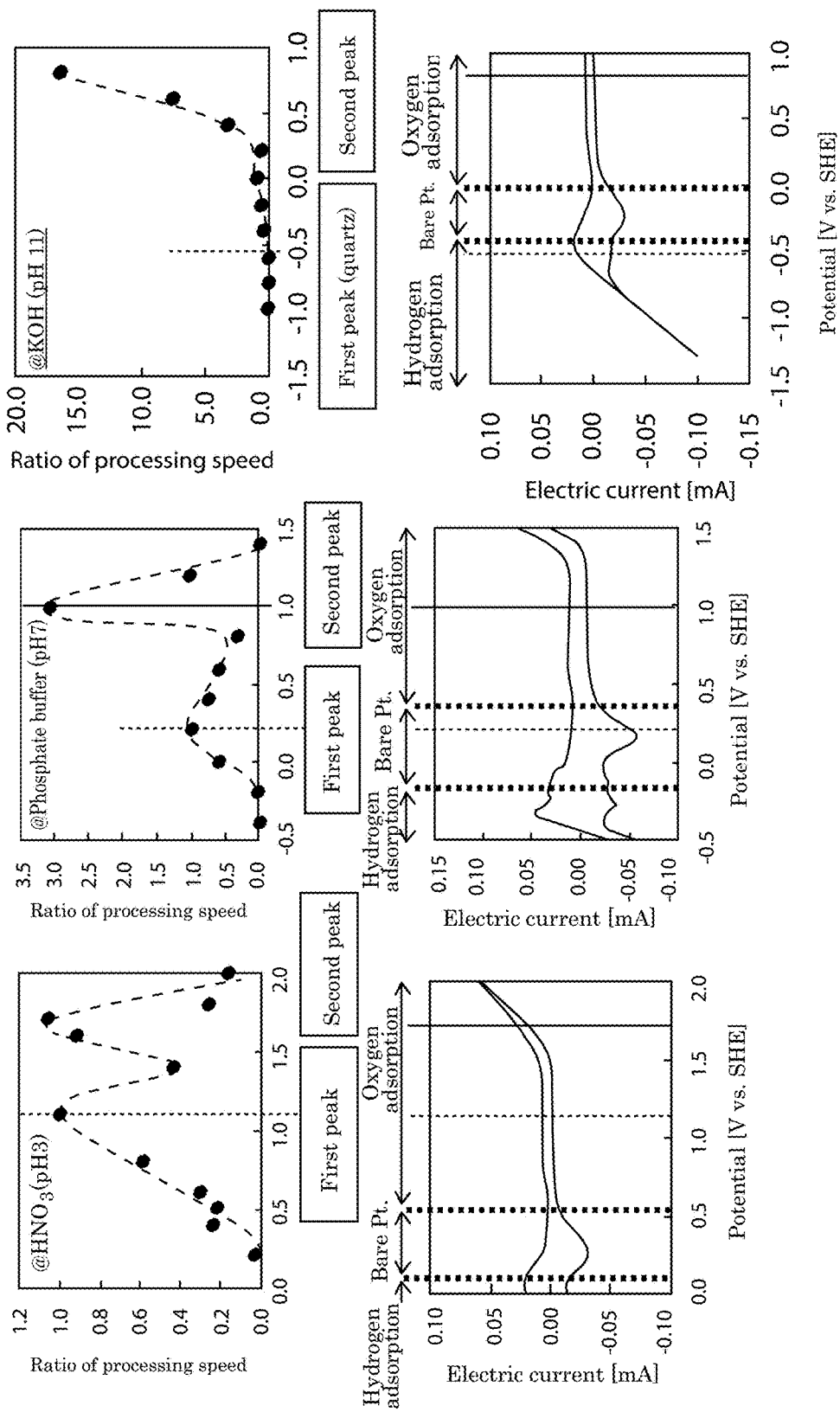
FIG. 20 is illustrations summarizing the dependence of the processing speed on the catalyst potential in FIGS. 14 to 16.

FIG. 20 collectively shows cyclic voltammograms and the dependences of the processing speed on the catalyst potential measured in the solutions. The cyclic voltammograms correspond to graphs of the dependence of the processing speed on the catalyst potential. Similarly to the above, the first peak is expressed by a dotted line, and the second peak is expressed by a solid line. The states of the platinum surface in the cyclic voltammograms are also shown correspondingly.

First, on the potential of the first peak (the dotted line), it is revealed that from the responsiveness, the state of the Pt surface is varied depending on the liquidity of the processing solution. In Water-CARE, it is estimated that hydrolysis reactions advance processing. The first peak was confirmed in both of quartz and SiC. Thus, it is considered that at this potential, the dependence related to direct hydrolysis reaction is shown. First, in the neutral solution (pH 7), the dependence caused only by the exposure of Pt, which is the catalyst, can be observed. Meanwhile, in the acidic solution (pH 3) and the basic solution (pH 1), it is revealed that the first peak is present at the potentials in the oxygen adsorption state and the hydrogen adsorption state. For example of the acidic solution, in the hydrolysis reaction, it is necessary to first dissociate a water molecule. However, it is considered that in an acidic atmosphere, i.e., in an atmosphere in which many hydrogen ions are present, oxygen is adsorbed to the Pt surface, causing the conditions equivalent to the dissociation of the water molecule to be ready, which easily facilitates processing. Meanwhile, it is considered that in the basic solution, a phenomenon opposite to the phenomenon in the acidic atmosphere occurs. Processing at a rest potential has this processing mechanism.

Next, on the potential of the second peak (the solid line), the peak potential corresponds to the advanced oxygen adsorption state in any solutions. Thus, it is considered that at the second peak position, many oxygens unstably adsorbed to the Pt surface are present. It is predicted that at the second peak, CARE processing assisted by oxidation reaction proceeds as well as hydrolysis.

As described above, in the experimental processing of 4H-SiC, it was confirmed that after the processing speed is decreased as the Pt catalyst potential comes closer to the oxygen production potential and the hydrogen production potential, the processing speed is suddenly increased in a range in which the Pt catalyst potential exceeds the oxygen production potential near the oxygen production potential. It is considered that this is because the surface oxidation of 4H-SiC at a portion in contact with the Pt catalyst is promoted to increase the processing speed. The tendency, in which the processing speed is decreased as the Pt catalyst potential comes closer to the oxygen production potential and the hydrogen production potential, is similar to the processing of metal oxides, such as quartz glass ($SiO_2$). However, the tendency has not been known so far, in which the processing speed is increased after the oxygen production potential is exceeded. With the positive use of the control region of the catalyst potential, a great improvement of the processing speed can be expected. Specifically, it can be said that processing using a neutral processing liquid at pH 7 is true Water-CARE. However, when the catalyst potential becomes too high, the amount of oxygen to be produced is increased, and oxygen resides between the work piece and the catalyst to degrade the catalytic effect, or to cause a problem in planarization. Thus, the upper limit was set in a range 1 V higher than the oxygen production potential. Therefore, in the present invention, the control potential E (V) is set in a range of $E_{O2} \pm 1$ V. In other words, the range of the control potential E (V) can be expressed by an equation below.

$$E_{O2} - 1 \leq E \leq E_{O2} + 1 \qquad \text{[Equation 2]}$$

The catalyst potential is controlled in the range expressed by Equation 2, allowing the processing speed to be controlled in a wide range. The other processing parameters are controlled, allowing the processing speed to be controlled in a wider range. With the combination of ultraviolet ray application, one processing apparatus can perform processes from coarse processing to finishing processing at atom level.

In order to achieve true Water-CARE, a configuration only has to be provided, in which a processing liquid is a neutral solution at pH 7, a buffer solution is appropriately added to the processing liquid, and the catalyst potential on the processing reference plane is set to a potential of 1 V±0.3 V (vs. SHE) in the case of processing a 4H-SiC substrate. In this case, no environmental burden is present at all, the handling of the processing liquid is extremely easy, and no polishing materials or no abrasive grains are used at all. Thus, a clean environment is provided, and running costs are inexpensive. Moreover, the cleaning work of the work piece after planarization becomes easy as well. The degradation of the catalytic metal is also reduced. Accordingly, the range of selecting catalytic substances is widened, and durability is also improved.

Example 3

Figure 21:
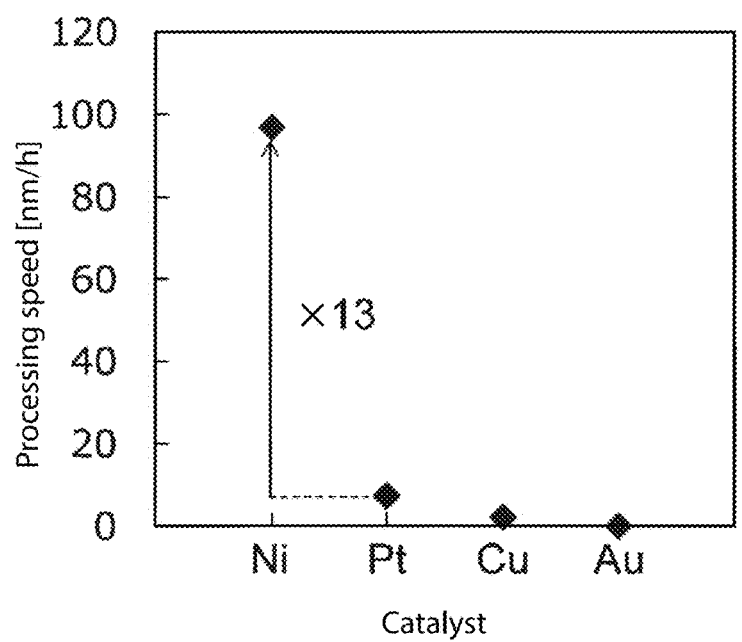
FIG. 21 is a graph illustrating the dependence of processing speed on a catalyst.

Lastly, the dependence of the processing speed on a catalyst was checked using catalytic substance balls 36 formed with various catalytic metals. A processing target is a 4H-SiC (0001) wafer. In the processing conditions, the catalysts were various metals, the processing liquid was pure water, the contact pressure was 2,000 hPa, and the rotational speed was 24 rpm. The potential of the catalytic metal was a rest potential. For a catalytic metal, Ni, Pt, Cu, and Au were tested. Each of the catalytic metals was formed in a film on the surface of a rubber ring by sputtering vapor deposition. The result is shown in FIG. 21.

Ni achieves the processing speed 13 times the processing speed of Pt. It can be considered that the processing speed can be further improved depending on the selection of catalytic substances. Also in GaN (0001), a similar tendency was observed in the dependence of the catalytic metal on the processing speed. In the present invention, water is basically used for the processing liquid. Thus, the number of types of applicable catalysts is large.

Here, the easiness of occurrence of dissociative adsorption to the catalytic metal can be qualitatively sorted by the electron unoccupancy in the d orbital. It is known that metals can be grouped as follows. Group A includes the groups 4, 5, 6, and 8 elements, such as Cr, Fe, and Mo, in which there are many unoccupied orbitals in the d orbital. Group B1 includes the groups 9 and 10 elements of Ni and Co, in which there are 1 to 3 unoccupied d orbitals. Group B2 includes the groups 9 and 10 elements, such as Pt and Pd. Group C includes the groups 7 and 11 elements of Cu and Mn. Group D includes the group 11 elements including Au, in which the d orbital is occupied. Group E includes the groups 11 and 12 elements, such as Ag and Zn. It is known that the chemical adsorption property is decreased in order of Groups A, B1, B2, C, D, and E.

The results show that there is clearly a correlation between the chemical adsorption property and the processing speed. It was found that the processing speed in the case of using Ni (Group B1) is one digit larger at the maximum than in the case of using Pt (Group B2). However, Cr (Group A) showed a poor result, seemingly because the surface state is unstable. In the case of using Au and Ag belonging to Group D or E, processing hardly proceeds because electrons occupy the d orbital.

As a result, for the catalytic metal formed of a single element, it is preferable to use metals belonging to Groups A, B1, and B2, in terms of the processing speed. Practically, metals relatively inexpensive and easily handled are selected and used. In this case, it is also preferable to use an alloy formed of a plurality of metal elements in addition to the simple substance of the metal element. In only Cu, the processing speed is slow, because electrons occupy the d orbital of Cu. However, insulating CuO has a catalyst function. As described above, even a metal having a poor catalyst function forms a compound, in which the d orbital of the electron of the metallic element is near Fermi level and emerges on the surface. In this compound, a water molecule is dissociated to cut back-bonding between an oxygen element and the other element forming an oxide film, and adsorbed to the elements for assisting the production of decomposition products by hydrolysis. The compound functions as a catalytic substance.

As described above, it is obvious in the present invention that the potential of the processing reference plane is changed, allowing the processing speed to be controlled. In addition, the pH of the processing liquid is changed, also allowing the processing speed to be controlled. Moreover, the processing pressure and the rotational speed are controlled, with further assistance of ultraviolet ray application, achieving the processing speed and the surface of the flatness in a wide range. In the case in which the surface of the work piece is processed into a given shape by numerical control, it is important to control the processing speed. According to the present invention, wide-bandgap semiconductors can be precisely processed.

REFERENCE SIGNS LIST

A Processing apparatus
B Processing apparatus
1 Water
2 Container
3 Processing reference plane
4 Processing pad
5 Work piece
6 Work piece holder
7 Driving mechanism
8 Voltage applying unit
9 Water circulation system
9A Supply pipe
9B Drain pipe
10 Processing reference plane
11 Processing pad
12 Work piece
13 Work piece holder
14 Driving mechanism
15 Water
16 Water supplying unit
17 Voltage applying unit
18 Container
30 Local processing apparatus
31 Water tank
32 Pure water
33 Glass
34 Motor
35 Rotating shaft
36 Catalytic substance ball
37 Z-stage
38 Horizontal plate
39 XY-stage
40 Work piece holder
41 Bearing
42 Head
43 Vertical panel
44 Frame
45 Plate spring
46 Balancer
47 Rotary joint
48 Reference electrode
49 Counter electrode

The invention claimed is:

1. A processing method for a wide-bandgap semiconductor substrate in which a single crystal, which is SiC, GaN, AlGaN, or AN, is a work piece, and a surface of the work piece is planarized or processed into an arbitrary curved surface using no abrasive grain or no abrasive, the method comprising:
   using a catalytic substance having a function of promoting direct hydrolysis of the work piece or promoting hydrolysis of an oxide film on the surface of the work piece as a processing reference plane;
   in presence of water, disposing the work piece and the processing reference plane so that the work piece is brought into contact with or close to a distance where a catalytic reaction of a catalytic substance occurs to the processing reference plane at a predetermined pressure;
   setting a potential of the processing reference plane in a range of ±1 V relative to an oxygen production potential to form a state in which oxygen is adsorbed to a catalyst surface;
   relatively moving the work piece and processing reference plane to each other;
   by a catalyst function of the processing reference plane, advancing a process of direct hydrolysis of the surface of the work piece or a process of oxidation of the surface of the work piece and hydrolysis of the oxide film in priority from a projection on the surface close to the processing reference plane; and
   removing a decomposition product.

2. The processing method for a wide-bandgap semiconductor substrate according to claim 1, wherein
   for the processing reference plane, a surface of the catalytic substance is used, in which a metallic element is contained and a d orbital of an electron of the metallic element is at about Fermi level.

3. The processing method for a wide-bandgap semiconductor substrate according to claim 2, wherein
   the metallic element is a transition metallic element.

4. The processing method for a wide-bandgap semiconductor substrate according to claim 1, wherein
   the water is a mixture in which at least one kind of a pH regulator, a buffer solution, or a complex solution that assists dissolution of the decomposition product is mixed in pure water or ultrapure water.

* * * * *